United States Patent
Kasano et al.

(10) Patent No.: US 9,088,008 B2
(45) Date of Patent: Jul. 21, 2015

(54) DISPLAY PANEL DEVICE, DISPLAY DEVICE, AND METHOD OF MANUFACTURING DISPLAY PANEL DEVICE

(75) Inventors: Masahiro Kasano, Osaka (JP); Takashi Ohta, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 13/429,945

(22) Filed: Mar. 26, 2012

(65) Prior Publication Data

US 2012/0175648 A1  Jul. 12, 2012

Related U.S. Application Data

(63) Continuation of application No. PCT/JP2010/005951, filed on Oct. 5, 2010.

(30) Foreign Application Priority Data

Oct. 15, 2009  (JP) .................. 2009-238772

(51) Int. Cl.
 *H01L 33/00* (2010.01)
 *H01L 51/52* (2006.01)
 *H01L 27/32* (2006.01)
(52) U.S. Cl.
 CPC ......... *H01L 51/5275* (2013.01); *H01L 27/3211* (2013.01); *H01L 2251/55* (2013.01)
(58) Field of Classification Search
 USPC ............... 257/88, 89, E33.055, E33.067, 257/E33.071, E33.073, 98; 438/22, 29; 349/56, 57, 61, 62, 65, 69, 95
 See application file for complete search history.

(56) References Cited

U.S. PATENT DOCUMENTS

| | | | |
|---|---|---|---|
| 6,700,634 B2 | 3/2004 | Taniguchi et al. | |
| 6,727,566 B1* | 4/2004 | Fukui et al. | 257/437 |
| 6,876,408 B2 | 4/2005 | Yamaguchi | |
| 7,453,636 B2* | 11/2008 | Yeo et al. | 359/453 |
| 7,813,042 B2* | 10/2010 | Mather et al. | 359/619 |

(Continued)

FOREIGN PATENT DOCUMENTS

| | | |
|---|---|---|
| JP | 04-134302 | 5/1992 |
| JP | 10-172756 | 6/1998 |

(Continued)

OTHER PUBLICATIONS

English translation, Kim, Korean Patent Publication No. 1020060114086A, published in original language on Nov. 6, 2006, all pages.*

(Continued)

*Primary Examiner* — Fernando L. Toledo
*Assistant Examiner* — Victoria K Hall
(74) *Attorney, Agent, or Firm* — Greenblum & Bernstein, P.L.C.

(57) ABSTRACT

Provided is a display panel device including a pixel unit including a luminescent layer, and a lens that covers a luminescent region of the luminescent layer placed above the pixel unit and that transmits light emitted from the luminescent layer. The height between a luminescent face of the luminescent region and an apex of the lens is uniform along the straight line in the long axis direction of the luminescent region. Furthermore, at both end parts of the lens, a cross-section of the light emitting side corresponding to the long axis direction of the luminescent region has a shape of an elliptic arc having a predetermined curvature.

15 Claims, 20 Drawing Sheets

(56) References Cited

U.S. PATENT DOCUMENTS

| | | | |
|---|---|---|---|
| 2001/0019378 A1 | 9/2001 | Yamaguchi | |
| 2003/0020399 A1* | 1/2003 | Moller et al. | 313/504 |
| 2003/0086030 A1 | 5/2003 | Taniguchi et al. | |
| 2004/0076336 A1* | 4/2004 | Bassi et al. | 382/274 |
| 2006/0007552 A1* | 1/2006 | Takakuwa et al. | 359/619 |
| 2006/0097291 A1* | 5/2006 | Takahashi et al. | 257/257 |
| 2007/0102714 A1* | 5/2007 | Lee et al. | 257/88 |
| 2007/0231503 A1* | 10/2007 | Hwang et al. | 428/1.1 |
| 2008/0102387 A1 | 5/2008 | Yukiko | |
| 2008/0136901 A1* | 6/2008 | Schwerdtner | 348/51 |
| 2008/0272449 A1* | 11/2008 | Inaba et al. | 257/432 |
| 2009/0168165 A1* | 7/2009 | Hoffman | 359/463 |
| 2009/0180180 A1* | 7/2009 | Shimshi et al. | 359/462 |
| 2009/0242911 A1* | 10/2009 | Ishihara et al. | 257/89 |
| 2010/0020264 A1* | 1/2010 | Ohkawa | 349/62 |
| 2014/0209943 A1* | 7/2014 | Yamamoto et al. | 257/89 |

FOREIGN PATENT DOCUMENTS

| | | | |
|---|---|---|---|
| JP | 10-288966 | 10/1998 | |
| JP | 2001-305306 | 10/2001 | |
| JP | 2003-140150 | 5/2003 | |
| JP | 2006-171284 | 6/2006 | |
| JP | 2006-343449 | 12/2006 | |
| JP | 2007-248493 | 9/2007 | |
| JP | 2010-040427 | 2/2010 | |
| JP | 2010-231010 | 10/2010 | |
| KR | 10-2006-0114086 | 11/2006 | |
| KR | 1020060114086 A * | 11/2006 | H05B 33/22 |
| KR | 10-0712291 | 4/2007 | |

OTHER PUBLICATIONS

International Search Report and Written Opinion for PCT/JP2010/005951, dated Jan. 25, 2011 along with an English translation of ISR.

Korea Office action, mail date is Jul. 24, 2013.

* cited by examiner

FIG. 8
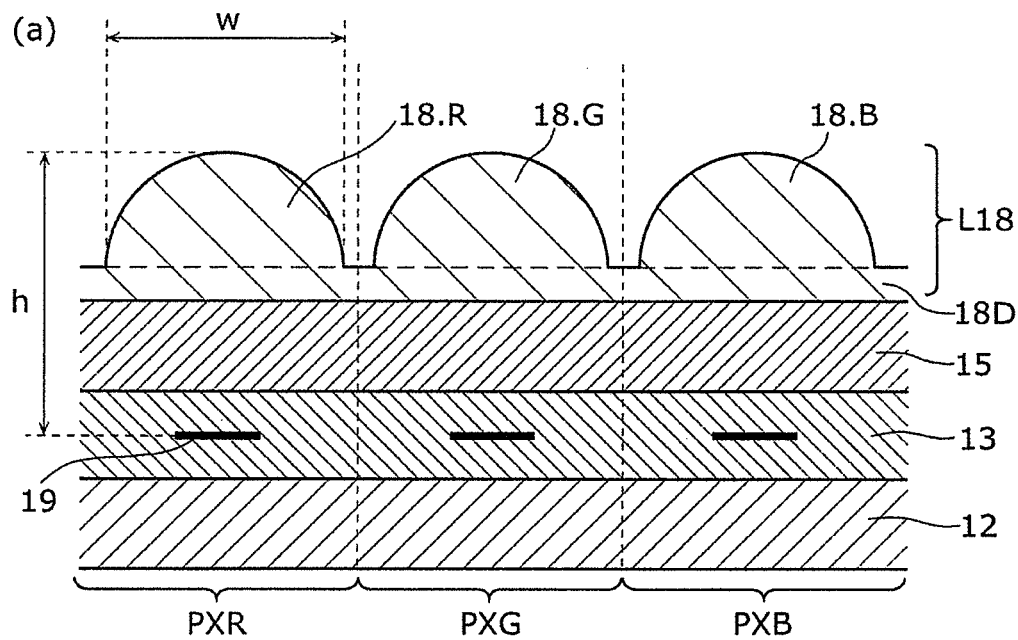
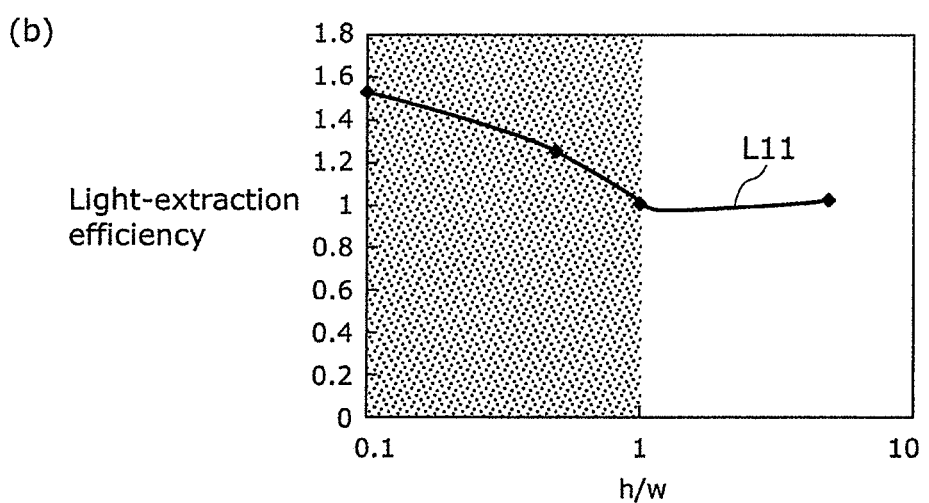

PRIOR ART

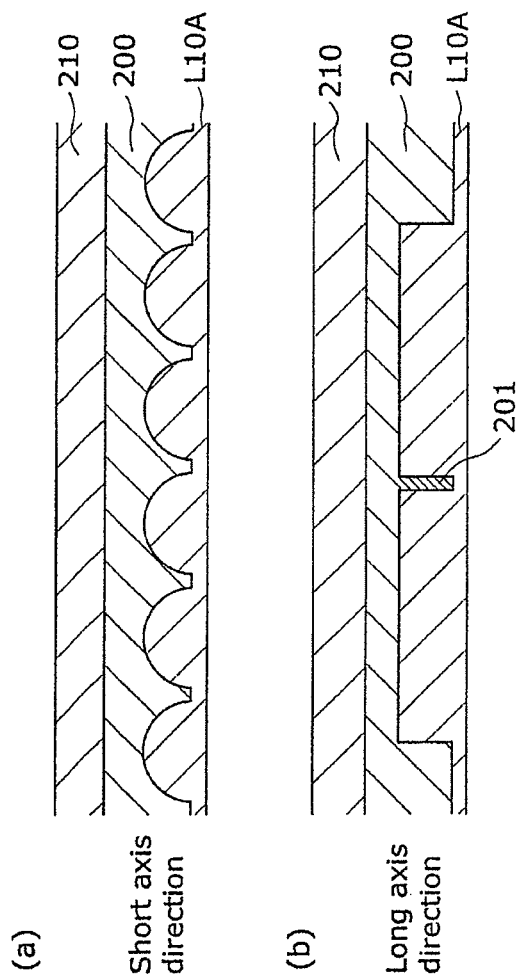

DISPLAY PANEL DEVICE, DISPLAY DEVICE, AND METHOD OF MANUFACTURING DISPLAY PANEL DEVICE

CROSS REFERENCE TO RELATED APPLICATION

This is a continuation application of PCT Patent Application No. PCT/JP2010/005951 filed on Oct. 5, 2010, designating the United States of America, which is based on and claims priority of Japanese Patent Application No. 2009-238772 filed on Oct. 15, 2009. The entire disclosures of the above-identified applications, including the specifications, drawings and claims, are incorporated herein by reference in their entirety.

TECHNICAL FIELD

The present disclosure relates to a display panel device and a display device using organic electro luminescence (EL) elements, and a method of manufacturing the display panel device and the display device, and in particular, a technique for improving the light-extraction efficiency of the organic EL elements.

BACKGROUND ART

The conventional technique for improving the light-extraction efficiency includes providing a microlens array in which round lenses are arranged above a luminescent face of the organic EL elements in the organic display device (for example, see PTL 1 and PTL 2). Here, each of the organic EL elements includes a cathode, an organic layer, and an anode. The organic layer is formed between the cathode and the anode. The organic EL elements are formed above a substrate.

The organic layer includes an electron injection layer, an electron transport layer, a luminescent layer, a hole transport layer, and a hole injection layer. The organic layer is a stacked layer of the hole injection layer, the hole transport layer, the luminescent layer, the electron transport layer, and the electron injection layer in this order with respect to the anode.

FIG. 20 illustrates a shape of a conventional lens LS10. FIG. 20 also illustrates a lens base layer LB10 for explanation. The lens base layer LB10 is a layer on which the lens LS10 is formed. The lens base layer LB10 is made of a material identical to that of the lens LS10.

The lens LS10 is formed on the lens base layer LB10. Hereinafter, a conventional lens including the lens LS10 and the lens base layer LB10 in FIG. 20 is referred to as a base-equipped lens 10BL.

The top illustration with "Top view" in FIG. 20(a) (hereinafter referred to as a top view JA) is a top view of the base-equipped lens 10BL.

Furthermore, the bottom illustration with "Cross section" and "Long axis direction" in FIG. 20(a) is a cross-section of the base-equipped lens 10BL in a long axis direction. Furthermore, the illustration with "Short axis direction" to the lower right of FIG. 20(a) is a cross-section of the base-equipped lens 10BL in a short axis direction.

The conventional lens LS10 has a shape that covers not an entire of a luminescent region LR10 but a part of the luminescent region LR10 as illustrated in the top view JA. The luminescent region LR10 is an area on which a luminescent layer is formed and which emits light.

FIG. 20(b) is a cross-section of the base-equipped lens 10BL along an A1-A1' line in the top view JA. FIG. 20(c) is a cross-section of the base-equipped lens 10BL along a B1-B1' line in the top view JA. FIG. 20(d) is a cross-section of the base-equipped lens 10BL along a C1-C1' line in the top view JA. FIG. 20(e) is a cross-section of the base-equipped lens 10BL along a D1-D1' line in the top view JA.

FIG. 20(f) is a cross-section of the base-equipped lens 10BL along an E1-E1' line in the top view JA.

FIG. 21 illustrates the light-extraction efficiency of the conventional lens LS10.

In FIG. 21, "Angle" denotes an angle between a direction of light traveling toward the luminescent face and a Z axis, in the light emitted from the luminescent region LR10. Here, the Z axis is vertical to the surface of the luminescent region LR10. "Intensity" denotes the intensity of light.

In FIG. 21, a characteristic curve L1 represents characteristics of the intensity of light when a lens (for example, the lens LS10) is not provided above each of the organic EL elements. Here, when no lens (for example, the lens LS10) is provided, assume that the intensity of light at 0 degree that is emitted from the luminescent region LR10 along the Z axis is represented by 1.

In FIG. 21, a characteristic curve L2 represents characteristics of the intensity of light when the conventional lens LS10 is provided above each of the organic EL elements. Compared to the case where the lens LS10 is not provided, the light-extraction efficiency will be improved with the lens LS10. As the light-extraction efficiency when the lens LS10 is not provided is represented by 1, the light-extraction efficiency when the lens LS10 is provided is represented by 1.31. In other words, compared to the case where the lens LS10 is not provided, the light-extraction efficiency will be improved with the lens LS10 by 31 percent.

CITATION LIST

Patent Literature

[PTL 1] Japanese Unexamined Patent Application Publication 10-172756
[PTL 2] Japanese Unexamined Patent Application Publication 4-134302

SUMMARY OF INVENTION

Technical Problem

However, the conventional lens LS10 has the following problem.

Here, each of FIGS. 20(b), 20(c), 20(d), 20(e), and 20(f) illustrates a light path of light that enters a position LP1 in the light emitted from the luminescent region LR10, and is then emitted from the position LP1.

Each of FIGS. 20(e) and 20(f) illustrates a state in which light enters the position LP1, is entirely emitted from the position LP1, and is extracted outside of the base-equipped lens 10BL. However, each of FIGS. 20(b), 20(c), and 20(d) illustrates a state where light enters the position LP1, and a part of the light emitted from the position LP1 is reflected from an interface between the lens base layer LB10 and an air space and is not extracted outside of the base-equipped lens 10BL.

In other words, there is a problem that as a distance between the conventional lens LS10 having the shape as illustrated in FIG. 20(a) and the center part of the luminescent region LR10 in the long axis direction of the lens LS10 is greater, the light-extraction efficiency decreases to a larger extent. This problem occurs because the cross section of the upper portion of the lens LS10 in the long axis direction has a shape of an elliptical arc.

The present disclosure has been conceived to solve the problem, and has an object of providing a display panel device and a display device that can achieve the higher light-extraction efficiency.

In order to solve the problem, a display panel device according to an aspect of the present disclosure includes: a pixel unit including a luminescent layer that defines a luminescent region in a shape having a long axis and a short axis; and a lens that is located above the pixel unit, covers the luminescent region, and transmits light emitted from the luminescent layer, wherein a height between a luminescent face of the luminescent region and an apex of the lens is uniform along a straight line in a long axis direction of the luminescent region, and in the lens, a cross-section of a light emitting side corresponding to a short axis direction of the luminescent region has a uniform shape in the long axis direction of the luminescent region in which the height is uniform, and at both end parts of the lens, each of (i) a cross-section of the light emitting side corresponding to the short axis direction of the luminescent region and (ii) a cross-section of the light emitting side corresponding to the long axis direction of the luminescent region has a shape of an elliptic arc having a predetermined curvature, and the lens deflects the light emitted from the luminescent layer in both of the short axis direction and the long axis direction of the luminescent region.

The lens that transmits the light emitted from the luminescent layer can achieve the higher light-extraction efficiency than that of the conventional lens, with the structure in which a height between a luminescent face of the luminescent region and an apex of the lens is uniform along a straight line in a long axis direction of the luminescent region, and at both end parts of the lens, each cross-section of the light emitting side corresponding to the long axis direction of the luminescent region has a shape of an elliptic arc having a predetermined curvature.

BRIEF DESCRIPTION OF DRAWINGS

These and other objects, advantages and features of the invention will become apparent from the following description thereof taken in conjunction with the accompanying drawings that illustrate a specific embodiment of the present disclosure. In the Drawings:

FIG. 8 illustrates lenses according to Embodiment 1;

FIG. 22 illustrates a part of an upper flat lens portion.

DESCRIPTION OF EMBODIMENT

Figure 1:
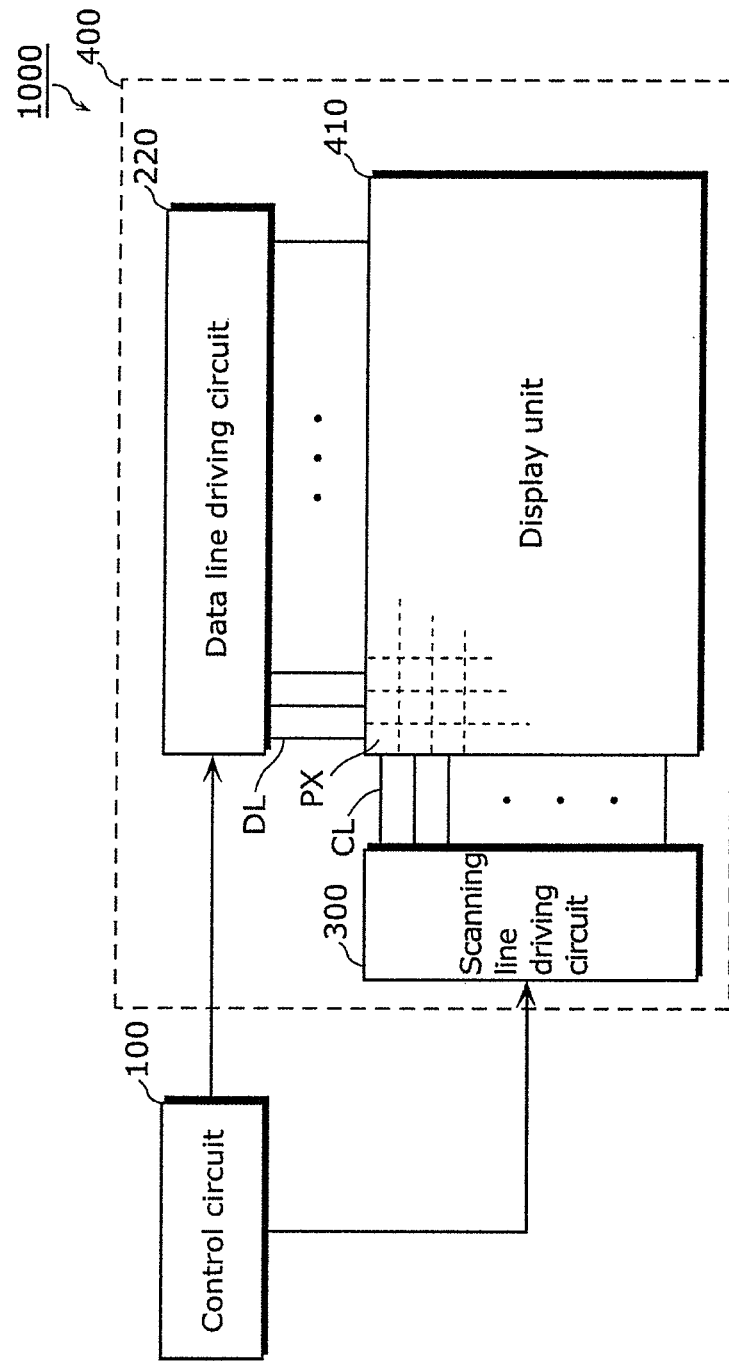
FIG. 1 is a block diagram illustrating a configuration of a display device 1000 according to Embodiment 1.

A display panel device according to an aspect of the present disclosure includes: a pixel unit including a luminescent layer that defines a luminescent region in a shape having a long axis and a short axis; and a lens that is located above the pixel unit, covers the luminescent region, and transmits light emitted from the luminescent layer, wherein a height between a luminescent face of the luminescent region and an apex of the lens is uniform along a straight line in a long axis direction of the luminescent region, and in the lens, a cross-section of a light emitting side corresponding to a short axis direction of the luminescent region has a uniform shape in the long axis direction of the luminescent region in which the height is uniform, and at both end parts of the lens, each of (i) a cross-section of the light emitting side corresponding to the short axis direction of the luminescent region and (ii) a cross-section of the light emitting side corresponding to the long axis direction of the luminescent region has a shape of an elliptic arc having a predetermined curvature, and the lens deflects the light emitted from the luminescent layer in both of the short axis direction and the long axis direction of the luminescent region.

According to the aspect, the height between the luminescent face of the luminescent region and the apex of the lens is uniform along the straight line in the long axis direction of the luminescent region, and the cross-section of the lens in the long axis direction at each end parts of the lens has a predetermined curvature.

Since the height between the luminescent face of the luminescent region and the apex of the lens is uniform along the straight line in the long axis direction of the luminescent region, the amount of light that vertically enters the surface of the straight line from among the light emitted from the luminescent layer is uniform along the straight line. Thus, it is possible to prevent the luminance of the light along the straight line from varying, and to make the luminance uniform. As a result, the light-extraction efficiency in the short axis direction can be improved.

Furthermore, at both end parts of the lens, each of (i) a cross-section of the light emitting side corresponding to the short axis direction of the luminescent region and (ii) a cross-section of the light emitting side corresponding to the long axis direction of the luminescent region has a shape of an elliptic arc having a predetermined curvature.

Accordingly, it is possible to significantly suppress the entire reflection of the light emitted from the luminescent layer, in both the long axis direction and the short axis direction of the luminescent region. As a result, an amount of extracted light can be increased around the entire periphery of the lens, and the light-extraction efficiency can be substantially improved.

Furthermore, end portions of the luminescent region in the long axis direction may be covered with the both end parts of the lens, each of the portions having the shape of the elliptic arc.

According to the aspect, the shape of the elliptic arc may include a shape of an arc.

Furthermore, the pixel unit may include a plurality of luminescent layers including the luminescent layer, a plurality of lenses may be provided for each of the luminescent layers, the lenses including the lens, the display panel device may further include a resin layer that is formed over the lenses to planarize unevenness formed by the lenses, and a surface of the lenses each having the shape of the elliptic arc may function as a guide face that causes a resin that is a material included in the resin layer to flow into depressed portions between the lenses, the surface being, at each of the both end parts, (i) the cross-section of the light emitting side corresponding to the short axis direction of the luminescent region and (ii) the cross-section of the light emitting side corresponding to the long axis direction of the luminescent region.

When a resin is applied to bond the lens to the sealing glass in manufacturing processes, the resin does not fill a hollow between pixels that are adjacent to each other when both end parts of the cross-section of the lens in the long axis direction have no curvature, and air enters the hollow. With the air entering the hollow, the characteristics of the lenses that have been determined in designing are changed, and the light-extraction efficiency decreases.

According to the aspect, the pixel unit includes a plurality of luminescent layers including the luminescent layer, a plurality of lenses is provided for each of the luminescent layers, the lenses including the lens, the display panel device further includes a resin layer that is formed over the lenses to planarize unevenness formed by the lenses, and a surface of the lenses each having the shape of the elliptic arc functions as a guide face that causes a resin that is a material included in the resin layer to flow into depressed portions between the lenses, the surface being, at each of the both end parts, (i) the cross-section of the light emitting side corresponding to the short axis direction of the luminescent region and (ii) the cross-section of the light emitting side corresponding to the long axis direction of the luminescent region.

Accordingly, the resin that is the material included in the resin layer flows along the surface of the elliptic arc shaped lenses, and fills the depressed portions between the lenses. Thus, the depressed portions between the lenses are filled with the resin layer, and it is possible to prevent air from entering the depressed portions between the lenses. As a result, it is possible to prevent the characteristics of the lens from changing, and to extract light with higher precision.

Furthermore, in order to cause the resin that is the material included in the resin layer to flow into the depressed portions between the lenses, the surface of the existing lenses is used rather than a separate guide component. Thus, the resin can fill the depressed portions between the lenses without thickening the layers stacked on the pixel units. As a result, it is possible to suppress thickening of the layers, prevent the characteristics of the lens from changing, and extract light with higher precision.

According to the aspect, the luminescent layers may include a red luminescent layer, a green luminescent layer, and a blue luminescent layer.

According to the aspect, the lens is made of a resin with a refractive index ranging between 1.6 and 2.1 inclusive.

Thus, it is possible to suppress the amount of light that is entirely reflected by a boundary of the lens among the light that enters the boundary, and it is possible to extract, at a maximum, the light that is not entirely reflected by the boundary, but is deflected from by the boundary. As a result, the light-extraction efficiency of the lens can be maximized.

Furthermore, the lens may be made of a first resin with a refractive index ranging between 1.6 and 2.1 inclusive, and the resin layer may be made of a second resin with a refractive index ranging between 1.1 and 1.5 inclusive.

According to the aspect, the resin layer is made of a second resin with a refractive index ranging between 1.1 and 1.5 inclusive.

Thus, it is possible to suppress the amount of light that is entirely reflected by a resin layer among the light that enters the resin layer, and it is possible to extract, at a maximum, the light that is not entirely reflected by the resin layer, but is deflected by the resin layer. As a result, when the light emitted from the lens enters the resin layer, the light-extraction efficiency of the light deflected by the resin layer, can be maximized.

According to the aspect, the display panel device satisfies $h/w \leq 1$, where w denotes a length of a bottom face of the lens that corresponds to the short axis direction of the luminescent region, and h denotes the height between the luminescent face of the luminescent region and the apex of the lens.

Accordingly, the height between the luminescent face of the luminescent region and the apex of the lens is set so that the light emitted from the luminescent face arrives at the apex of the lens without disappearing from between the luminescent face of the luminescent region and the apex of the lens. Accordingly, it is possible to extract the light emitted from the luminescent face, at the apex of the lens at a maximum. As a result, the light-extraction efficiency can be maximized.

Furthermore, the height between the luminescent face of the luminescent region and the apex of the lens may be defined according to one of red, green, and blue of the light emitted from the luminescent layer.

The height of the luminescent layer from the luminescent face of the luminescent region of the luminescent layer to the apex of the lens that makes the light-extraction efficiency optimal is different for each of the colors.

According to the aspect, the height between the luminescent face of the luminescent region and the apex of the lens is defined according to one of red, green, and blue of the light emitted from the luminescent layer. Accordingly, the height of the luminescent layer that makes the light-extraction efficiency optimal is defined for each of red, green, and blue, the light-extraction efficiency can be maximized for each of the colors.

When a cross-section of the lens in the long axis direction is projected on an x-z plane, a shape of the cross-section of the lens in the long axis direction may be defined by:

$$\frac{(x-c)^2}{d^2} + \frac{z^2}{b^2} = 1 \ (c \leq |x| \leq d); \quad \text{(Equation 1)}$$

and $$z = b \ (|x| \leq c), \quad \text{(Equation 2)}$$

where x denotes the long axis direction of the lens, z denotes a height direction of the lens, c denotes a length of a range in which the height between the luminescent face of the luminescent region and the apex of the lens is uniform along the straight line in the long axis direction of the lens, a length of the lens in the long axis direction is represented by 2(c+d), and b denotes a height between a bottom face and the apex of the lens, and when the cross-section of the lens is projected on a y-z plane, the shape of the cross-section of the lens in the short axis direction may be defined by:

$$\frac{y^2}{a^2} + \frac{z^2}{b^2} = 1,$$ (Equation 3)

where y denotes the short axis direction of the lens, z denotes the height direction of the lens, and the length of the lens in the short axis direction is represented by 2a.

According to the aspect, the lens may be a convex lens.

Furthermore, the pixel unit may include an upper electrode and a lower electrode, and the luminescent layer may be provided between the upper electrode and the lower electrode.

Furthermore, the pixel unit may further include a hole injection layer between the luminescent layer and the lower electrode.

A display device according to another aspect of the present disclosure includes the display panel device, wherein a plurality of pixel units is arranged in a matrix, the pixel units including the pixel unit.

According to another aspect of the present disclosure, a method of manufacturing a display panel device includes: preparing a lens portion including a lens that covers a luminescent region to correspond to a luminescent layer that defines the luminescent region in a shape having a long axis and a short axis, the lens transmitting light emitted from the luminescent layer; preparing a pixel unit that includes the luminescent layer and is covered with a sealing layer; forming a resin layer beneath the lens portion; and bonding the lens portion to the pixel unit, and curing the resin layer, wherein a height between a luminescent face of the luminescent region and an apex of the lens is uniform along a straight line in a long axis direction of the luminescent region, and in the lens, a cross-section of a light emitting side corresponding to a short axis direction of the luminescent region has a uniform shape in the long axis direction of the luminescent region in which the height is uniform, and at both end parts of the lens, each of (i) a cross-section of the light emitting side corresponding to the short axis direction of the luminescent region and (ii) a cross-section of the light emitting side corresponding to the long axis direction of the luminescent region has a shape of an elliptic arc having a predetermined curvature, and the lens deflects the light emitted from the luminescent layer in both of the short axis direction and the long axis direction of the luminescent region.

A display panel device and a display device according to Embodiment 1 of the present disclosure will be described hereinafter with reference to drawings. The same reference numerals will be assigned to the same constituent elements hereinafter. The names and the functions are the same. Thus, the detailed description thereof will not be repeated. Furthermore, a part of the drawings may be deformed by emphasizing it for description, and the ratios used in the drawings are not always correct.

Embodiment 1

Configuration of Display Device

FIG. 1 is a block diagram illustrating a configuration of a display device 1000 according to Embodiment 1. As illustrated in FIG. 1, the display device 1000 includes a control circuit 100 and a display panel device 400.

The display panel device 400 is an active-matrix display device. The display panel device 400 may be a passive-matrix display device. The display panel device 400 is an organic EL panel using organic EL elements. The display panel device 400 is a top-emission device. The display panel device 400 may be a bottom-emission device.

The display panel device 400 includes a data line driving circuit 220, a scanning line driving circuit 300, and a display unit 410.

The control circuit 100 controls the data line driving circuit 220 and the scanning line driving circuit 300.

The display unit 410 includes a plurality of pixel units PX. The pixel units PX are arranged in a matrix. Each of the pixel units PX emits light according to a signal supplied from outside of the display panel device 400.

Figure 2:
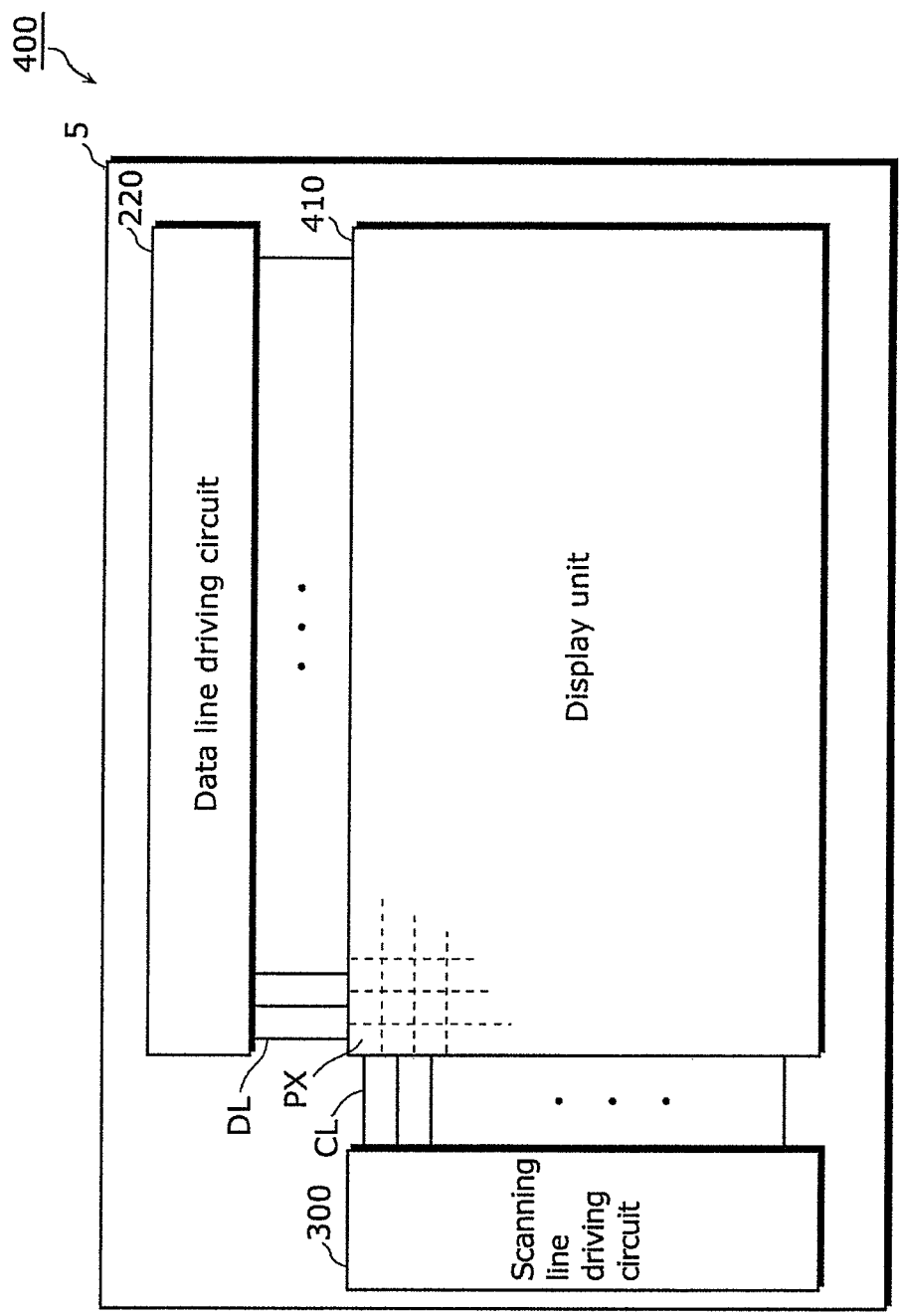
FIG. 2 schematically illustrates a layout of a display panel device.

FIG. 2 schematically illustrates a layout of the display panel device 400.

With reference to FIG. 2, the data line driving circuit 220, the scanning line driving circuit 300, and the display unit 410 are formed on a substrate 5.

Figure 3:
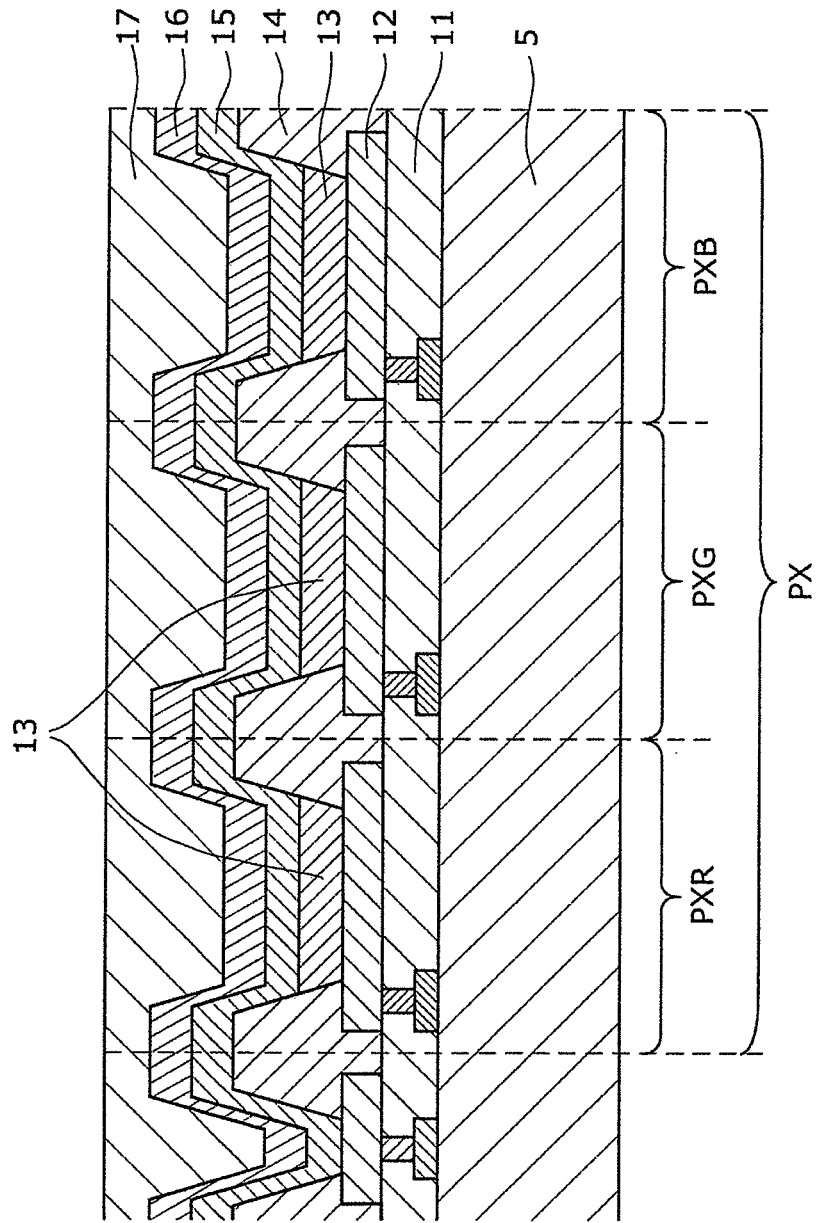
FIG. 3 is an example cross-section of a structure of a pixel unit.

FIG. 3 is an example cross-section of a structure of one of the pixel units PX. FIG. 3 also illustrates a sealing layer 16 and a resin layer 17 that are not included in the pixel unit PX.

With reference to FIG. 3, the pixel unit PX includes sub-pixel units PXR, PXG, and PXB.

The sub-pixel unit PXR, the sub-pixel unit PXG, and the sub-pixel unit PXB are pixel units that emit red light, green light, and blue light, respectively.

Here, the structure of the sub-pixel unit PXB will be described as one example.

The sub-pixel unit PXB includes the substrate 5, an insulating layer 11, an anode 12 functioning as a lower electrode, an organic layer 13, and a cathode 15 functioning as an upper electrode.

The insulating layer 11 is a layer that insulates a line layer, and is formed on the substrate 5.

The anode 12 is an electrode having light reflectivity, and is formed on the insulating layer 11. The organic layer 13 is a layer that emits light.

Figure 4:
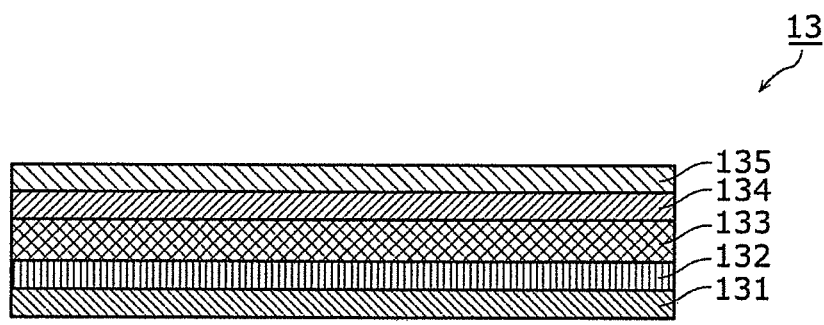
FIG. 4 is an example cross-section of a structure of an organic layer.

FIG. 4 is an example cross-section of a structure of the organic layer 13.

With reference to FIG. 4, the organic layer 13 includes a hole injection layer 131, a hole transport layer 132, a luminescent layer 133, an electron transport layer 134, and an electron injection layer 135.

The hole injection layer 131 is a layer mainly made of a material with hole injection properties, and is formed on the anode 12. The hole transport layer 132 is a layer mainly made of a material with hole transport properties, and is formed on the hole injection layer 131.

The luminescent layer 133 is a layer mainly made of an organic luminescent material that emits light by recombination of the holes and the electrons, and is formed on the hole transport layer 132.

The electron transport layer 134 is a layer mainly made of a material with electron transport properties, and is formed on the luminescent layer 133. The electron injection layer 135 is formed on the electron transport layer 134.

The organic layer 13, which is not limited to the one illustrated in FIG. 4, may only include the hole injection layer 131, the hole transport layer 132, the luminescent layer 133, and the electron transport layer 134.

Again with reference to FIG. 3, the cathode 15 is a transparent electrode having light transparency, and is formed on the organic layer 13 (the electron injection layer 135).

The anode 12, the organic layer 13, and the cathode 15 form a luminescent element. The luminescent element is an organic EL element.

The organic layer 13 is formed between the cathode 15 functioning as an upper electrode and the anode 12 functioning as a lower electrode. In other words, the luminescent layer 133 included in the organic layer 13 is formed between the cathode 15 functioning as the upper electrode and the anode 12 functioning as the lower electrode. Furthermore, the hole injection layer 131 is formed between the luminescent layer 133 and the anode 12 functioning as the lower electrode.

The sealing layer 16 is a layer that prevents moisture content and oxygen in outside air from entering, and is formed on the cathode 15. The resin layer 17 is formed on the sealing layer 16.

Since each of the sub-pixel units PXR and PXG has the same structure as that of the sub-pixel unit PXB, the detailed description thereof will not be repeated hereinafter.

The luminescent layer 133 included in the sub-pixel unit PXR is a luminescent layer (hereinafter referred to as a red luminescent layer) that mainly emits red light. The red luminescent layer is a luminescent layer including a material for emitting red light. The luminescent layer 133 included in the sub-pixel unit PXG is a luminescent layer (hereinafter referred to as a green luminescent layer) that mainly emits green light. The green luminescent layer is a luminescent layer including a material for emitting green light. The luminescent layer 133 included in the sub-pixel unit PXB is a luminescent layer (hereinafter referred to as a blue luminescent layer) that mainly emits blue light. The blue luminescent layer is a luminescent layer including a material for emitting blue light.

As described above, the pixel unit PX includes the sub-pixel units PXR, PXG, and PXB. Thus, the pixel unit PX includes the red luminescent layer, the green luminescent layer, and the blue luminescent layer. Furthermore, each of the sub-pixel units PXR, PXG, and PXB includes the anode 12 functioning as the lower electrode and the cathode 15 functioning as the upper electrode. In other words, each of the pixel units PX includes the anode 12 functioning as the lower electrode and the cathode 15 functioning as the upper electrode.

Above the substrate 5, a plurality of banks 14 is formed. Each of the banks 14 defines an area in which the organic layer 13, the cathode 15, and the sealing layer 16 are formed.

Figure 5:
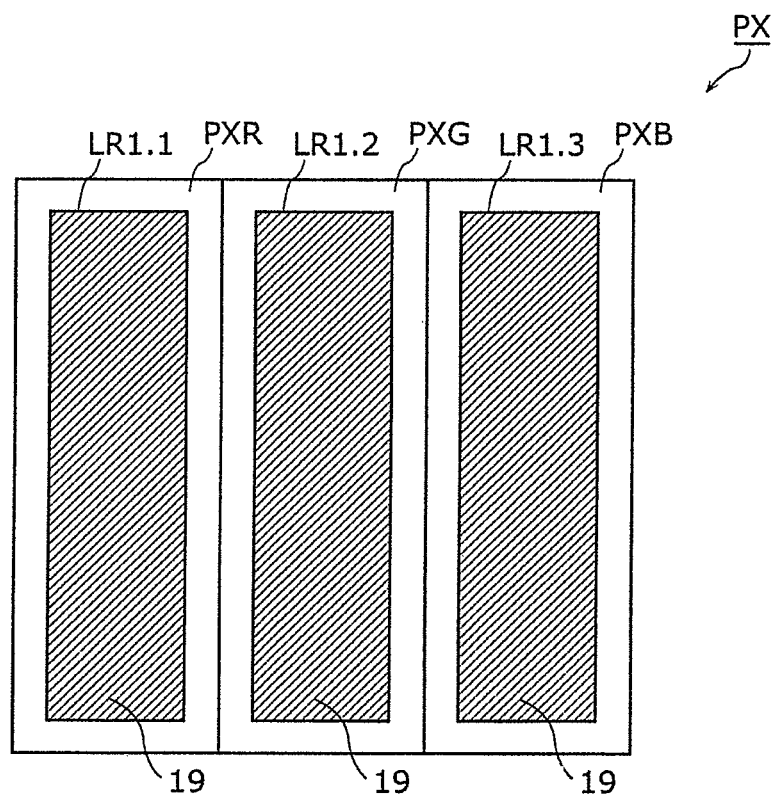
FIG. 5 is a top view illustrating an example of a structure of the pixel unit.

FIG. 5 is a top view illustrating an example of the structure of one of the pixel units PX.

With reference to FIG. 5, the pixel unit PX includes the sub-pixel units PXR, PXG, and PXB as described above.

Hereinafter, each of the sub-pixel units PXR, PXG, and PXB is also simply referred to as a sub-pixel unit. In other words, the display unit 410 includes a plurality of sub-pixel units. As described above, the pixel units PX are arranged in a matrix. Accordingly, the sub-pixel units included in the display unit 410 are arranged in a matrix.

The sub-pixel units PXR, PXG, and PXB include luminescent regions LR1.1, LR1.2, and LR1.3, respectively. Each of the luminescent regions LR1.1, LR1.2, and LR1.3 is a region formed in the luminescent layer 133 in a corresponding one of the sub-pixel units. For example, the luminescent region LR1.1 is a region formed in the luminescent layer 133 in the sub-pixel unit PXR. Each of the luminescent regions LR1.1, LR1.2, and LR1.3 has a luminescent face 19. The luminescent face 19 is a surface from which light is emitted.

Hereinafter, each of the luminescent regions LR1.1, LR1.2, and LR1.3 is also simply referred to as a luminescent region LR1. Each of the luminescent regions LR1 is rectangular. In other words, each of the luminescent regions LR1 has a long axis and a short axis. The luminescent layer 133 defines the shape of the luminescent region LR1 in the shape having the long axis and the short axis.

Again with reference to FIGS. 1, 2, and 3, the display unit 410 is electrically connected to the scanning line driving circuit 300 through scanning lines CL. Each of the scanning lines CL is electrically connected to the sub-pixel units that are aligned in the rows. The scanning line driving circuit 300 transmits respective control signals to the scanning lines CL. Each of the scanning lines CL is an electric cable for supplying the control signal to the sub-pixel unit to be processed.

Furthermore, the display unit 410 is electrically connected to the data line driving circuit 220 through data lines DL. Each of the data lines DL is electrically connected to the sub-pixel units that are aligned in the columns. The data line driving circuit 220 transmits respective image signals for causing the sub-pixel units to emit light, to the data lines DL. Each of the data lines DL is a data line for supplying the image signal to the sub-pixel unit to be processed.

The display unit 410 further includes a plurality of lens portions L18. The lens portions L18 are respectively provided above the pixel units PX included in the display unit 410. As described above, the pixel units PX are arranged in a matrix. Thus, the lens portions L18 are arranged in a matrix. Hereinafter, lenses of the lens portions L18 included in the display panel device 400 will be referred to as a lens portion L18A.

Figure 6:
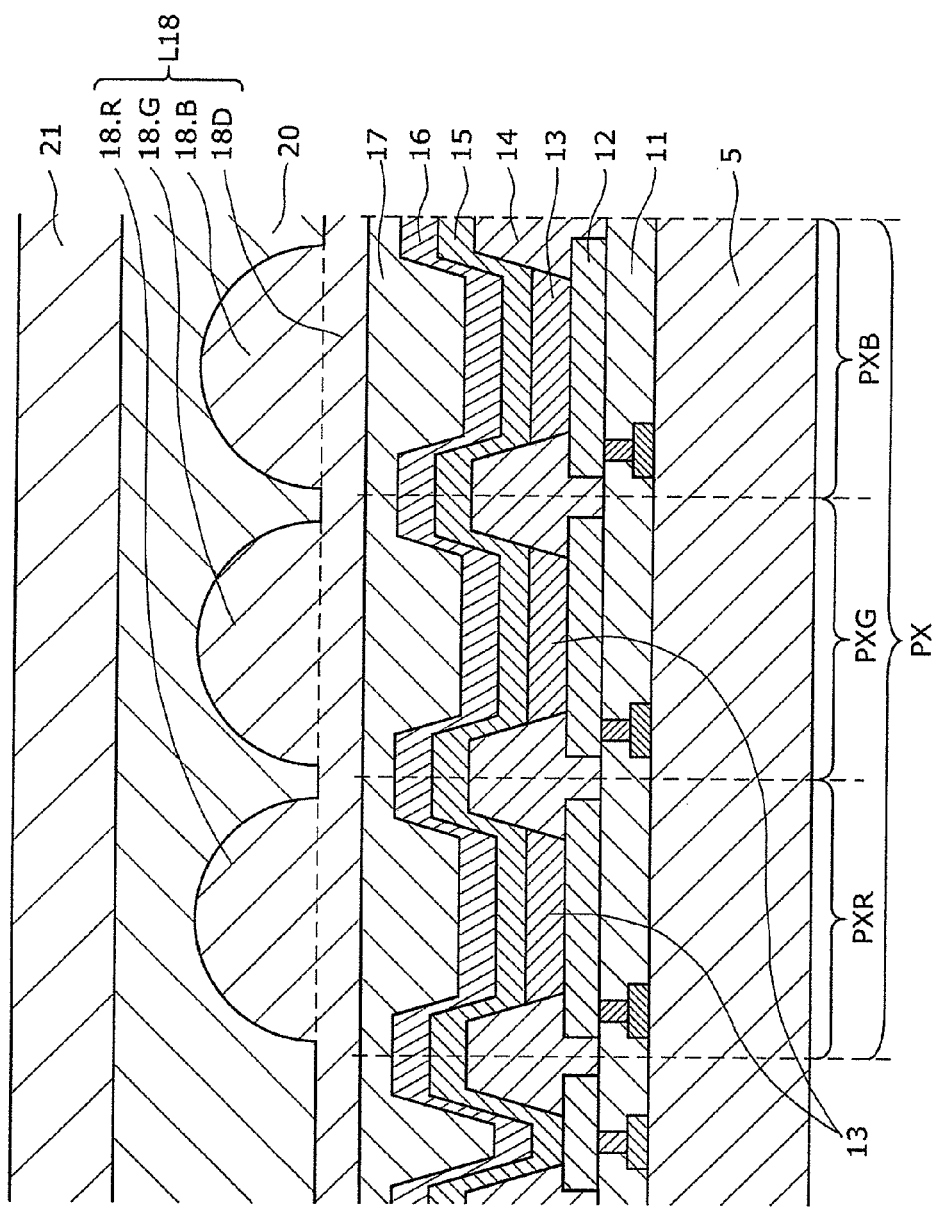
FIG. 6 is an example cross-section of a structure of a lens portion.

FIG. 6 is an example cross-section of a structure of one of the lens portions L18. FIG. 6 also illustrates the pixel unit PX for explanation. The detailed description of the reference numerals used in FIG. 3 will not be repeated for FIG. 6.

With reference to FIG. 6, the lens portion L18 is formed above the pixel unit PX. The lens portion L18 is bonded to the sealing layer 16 with the resin layer 17.

The lens portion L18 includes lenses 18.R, 18.G, and 18.B, and a lens base layer 18D. The lenses 18.R, 18.G, and 18.B are formed on the lens base layer 18D.

The lens 18.R is provided above the red luminescent layer (the luminescent layer 133) included in the organic layer 13 in the sub-pixel unit PXR. The lens 18.G is provided above the green luminescent layer (the luminescent layer 133) included in the organic layer 13 in the sub-pixel unit PXG. The lens 18.B is provided above the blue luminescent layer (the luminescent layer 133) included in the organic layer 13 in the sub-pixel unit PXB. In other words, the lens 18.R, the lens 18.G, and the lens 18.B correspond to the red luminescent layer, the green luminescent layer, and the blue luminescent layer, respectively.

The display unit 410 further includes a resin layer 20 and a sealing glass 21. The resin layer 20 is a layer for bonding the sealing glass 21 to the lens portion L18. The resin layer 20 is made of a transparent material, such as an epoxy resin.

The resin layer 20 is formed over the lens 18.R, 18.G, and 18.B. The resin layer 20 is a layer for planarizing unevenness formed by the lenses 18.R, 18.G, and 18.B.

Hereinafter, each of the lenses 18.R, 18.G, and 18.B is also simply referred to as a lens 18. Each of the lenses 18 is a transparent lens. The lens 18 is a convex lens.

The lens base layer 18D is a layer on which the lenses 18 are formed. The lens base layer 18D is made of the same material as that of the lenses 18. In other words, the lens base layer 18D is a transparent layer.

Figure 7:
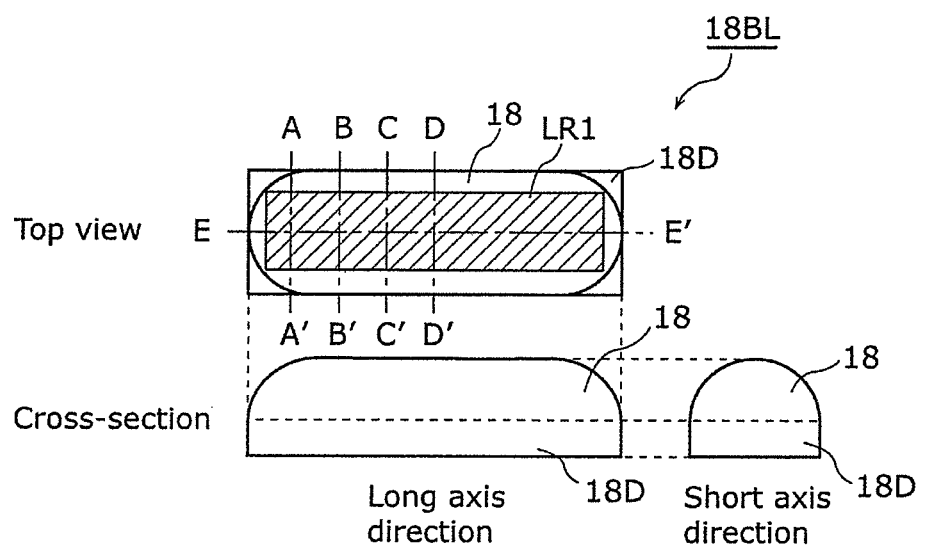
FIG. 7 illustrates a shape of a lens.

FIG. 7 illustrates a shape of the lens 18. FIG. 7 also illustrates the lens base layer 18D for explanation. The lens 18 is formed on the lens base layer 18D. Hereinafter, the lens 18 including the lens base layer 18D in FIG. 7 is referred to as a base-equipped lens 18BL.

The illustration with "Top view" in FIG. 7 (hereinafter referred to as a top view PA) is a top view of the base-equipped lens 18BL.

As illustrated in the top view PA, the lens 18 has a shape that covers the corresponding luminescent region LR1. In other words, the lens 18 is provided above the pixel unit PX, and covers the corresponding luminescent region LR1. The lens 18 transmits the light emitted from the corresponding luminescent layer 133.

For example, the lens 18 is assumed to be the lens 18.R. In this case, the lens 18.R is provided above the pixel unit PX, and covers the corresponding luminescent region LR1.1. Furthermore, the lens 18.R transmits the light emitted from the red luminescent layer (the luminescent layer 133) included in the organic layer 13 in the sub-pixel unit PXR. When the light passes through the lens 18.R, the light is slightly deflected.

In other words, the lens 18 deflects the light emitted from the luminescent layer 133, both in the short axis direction and the long axis direction of the luminescent region LR1.

Furthermore, the illustration with "Cross section" and "Long axis direction" in FIG. 7 is a cross-section of the base-equipped lens 18BL in the long axis direction. Furthermore, the illustration with "Short axis direction" to the lower right of FIG. 7 is a cross-section of the lens 18 in the short axis direction.

FIG. 8 illustrates the lenses 18 according to Embodiment 1.

FIG. 8(a) is a cross-section simply illustrating a part of FIG. 6. FIG. 8(a) illustrates the luminescent faces 19. Each of the luminescent faces 19 is a face within the luminescent region LR1. In other words, each of the luminescent faces 19 is a face formed in the luminescent layer 133.

The lens 18 (for example, the lens 18.R) is assumed to have a width of w in the short axis direction. In other words, w denotes a length of a bottom face of the lens 18 that corresponds to the short axis direction of the luminescent region LR1. Furthermore, h denotes a height between the luminescent face 19 of the luminescent region LR1 and the apex of the lens 18.

FIG. 8(b) is a graph of a characteristics line L11 representing a relationship between a value h/w and the light-extraction efficiency.

FIG. 8(b) indicates that the light-extraction efficiency will be improved when the value h/w<1, compared to the case where the value h/w=1. In contrast, when h/w>1, the light-extraction efficiency becomes almost 1, and is not improved. Thus, h/w≤1 is preferable. In other words, the display unit 410 according to Embodiment 1 is configured to satisfy h/w≤1.

Figure 9:
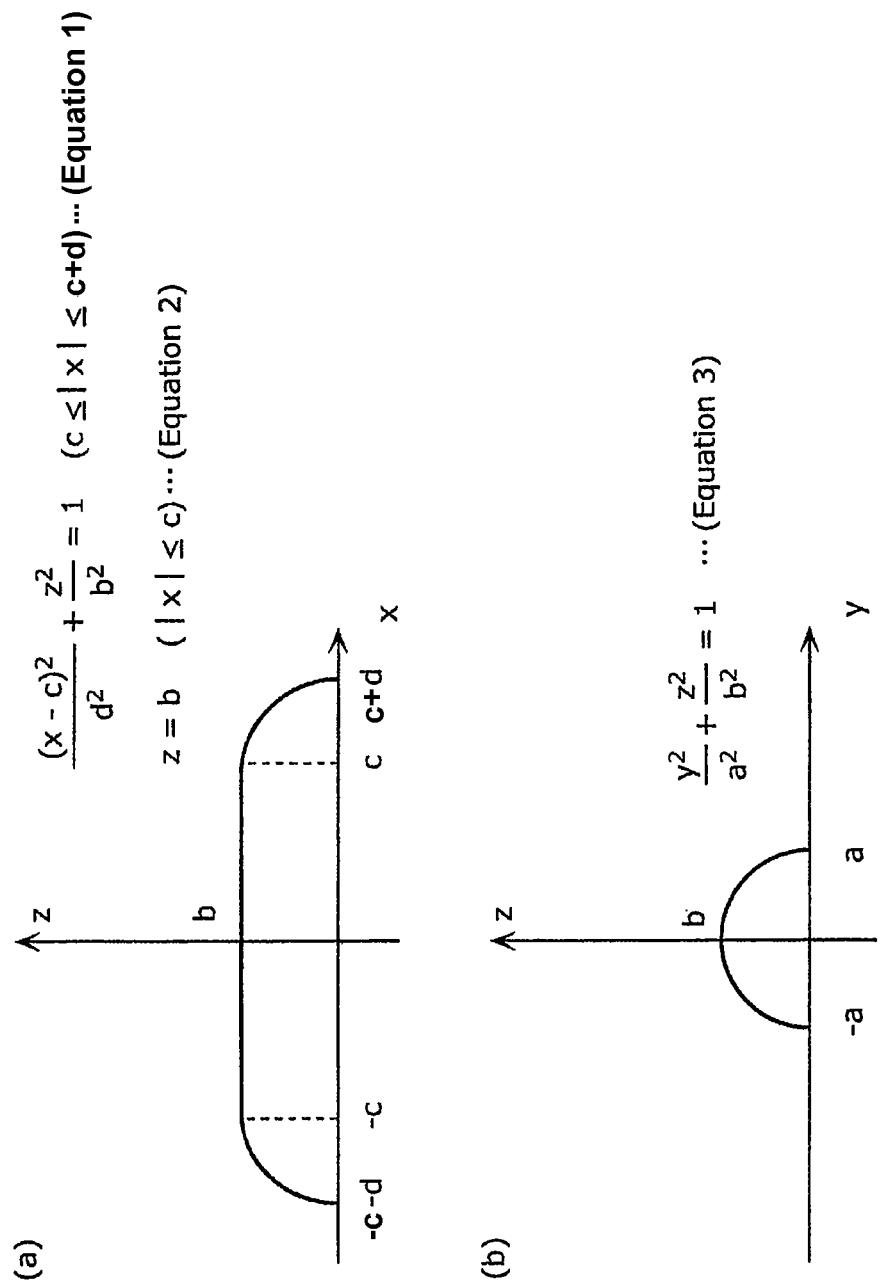
FIG. 9 illustrates a cross-section shape of the lens.

FIG. 9 illustrates a shape of a cross-section of the lens 18.

FIG. 9(a) illustrates the shape of the cross-section of the lens 18 in the long axis direction.

With reference to FIG. 9(a), the cross-section of the lens 18 in the long axis direction is assumed to be projected on an x-z plane, where x denotes the long axis direction of the lens 18, and z denotes the height direction of the lens 18.

Here, c denotes a length of a range in which a height between the luminescent face 19 of the luminescent region LR1 and the apex of the lens 18 is uniform along the straight line in the long axis direction of the lens 18, a length of the long axis direction of the lens 18 is represented by 2(c+d), and b denotes a height between the bottom face and the apex of the lens 18.

Here, the shape of the cross-section of the lens 18 in the long axis direction is defined by Equations 1 and 2 below.

$$\frac{(x-c)^2}{d^2} + \frac{z^2}{b^2} = 1 \quad c \le |x| \le c+d \quad \text{(Equation 1)}$$

$$z = b \quad |x| \le c \quad \text{(Equation 2)}$$

In other words, the cross-section of the lens 18 in the long axis direction has a uniform height in a range of $-c \le x \le c$. In other words, the height between the luminescent face 19 of the luminescent region LR1 and the apex of the lens 18 is uniform along the straight line in the long axis direction of the luminescent region LR1.

Furthermore, at both end parts of the lens 18 ($-c-d \le x \le -c$, $c \le x \le c+d$), the cross-section of the light emitting side corresponding to the long axis direction of the luminescent region LR1 has a shape of an arc having a predetermined curvature. Here, the cross-section of the light emitting side corresponding to the long axis direction of the luminescent region LR1 may have a shape of, not limited to the arc, an elliptic arc. Here, the shape of the elliptic arc includes the shape of the arc.

Furthermore, with reference to FIGS. 7 and 9(a), above the luminescent region LR1 in the long axis direction, the end parts of the cross-section of the light emitting side in the lens 18 are covered with the elliptic arc portions. In the top view PA of FIG. 7, each of the end parts of the luminescent region LR1 in the long axis direction is, for example, a portion to the left of the A-A' line within the luminescent region LR1.

In other words, the height between the luminescent face 19 of the luminescent region LR1 and the apex of the lens 18 may not be uniform along the straight line in the long axis direction of the luminescent region LR1.

In other words, the height between the luminescent face 19 of the luminescent region LR1 and the apex of the lens 18 at a first position may be different from a height between the luminescent face 19 of the luminescent region LR1 and the apex of the lens 18 at a second position, along the straight line in the long axis direction of the luminescent region LR1. Here, the first position is a position on a line segment where z=b, in a range of $-c \le x \le c$ as illustrated in FIG. 9(a). Furthermore, the second position is, for example, a position on the E-E' line and to the left of the A-A' line within the luminescent region LR1, in the top view PA of FIG. 7.

FIG. 9(b) illustrates the shape of the cross-section of the lens 18 in the short axis direction.

With reference to FIG. 9(b), the cross-section of the lens 18 in the short axis direction is assumed to be projected on a y-z plane, where y denotes the short axis direction of the lens 18, and z denotes the height direction of the lens 18.

Assuming that the length of the lens 18 in the short axis direction is represented by 2a, the shape of the cross-section of the lens 18 in the short axis direction is defined by Equation 3 below.

$$\frac{y^2}{a^2} + \frac{z^2}{b^2} = 1 \quad \text{(Equation 3)}$$

In other words, the cross-section of the lens 18 in the short axis direction has a shape of an arc. In other words, the cross-section of the light emitting side corresponding to the short axis direction of the luminescent region LR1 has the shape of the arc.

Here, the cross-section of the light emitting side corresponding to the short axis direction of the luminescent region LR1 may have the shape of, not limited to the arc, an elliptic arc having a predetermined curvature. Here, the shape of the elliptic arc includes the shape of the arc.

Furthermore, the cross-section of the lens 18 in the short axis direction is uniform within the range of −c≤x≤c in FIG. 9(a). As described above, the range of −c≤x≤c is a portion in which the height between the luminescent face 19 of the luminescent region LR1 and the apex of the lens 18 is uniform along the straight line in the long axis direction of the luminescent region LR1.

In other words, in the lens 18, the cross-section of the light emitting side corresponding to the short axis direction of the luminescent region LR1 is uniform in the long axis direction of the luminescent region LR1 in which the height is uniform.

Figure 10:
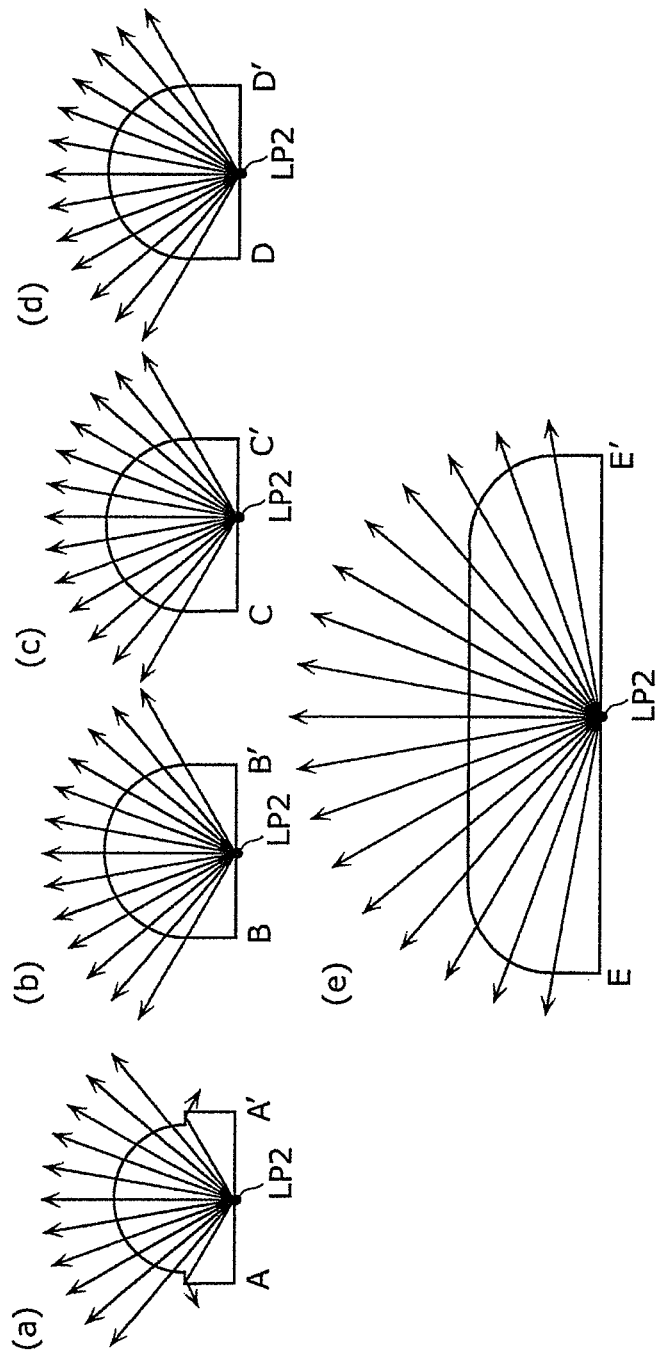
FIG. 10 illustrates light paths of light that enters a base-equipped lens.

FIG. 10 illustrates light paths of light that enters the base-equipped lens 18BL. The base-equipped lens 18BL is assumed to have all the elements (for example, optical characteristics) other than the shape, in common with those of the base-equipped lens 10BL in FIG. 20(a).

For example, the width, the height, and the refractive index of the base-equipped lens 18BL are assumed to be identical to those of the base-equipped lens 10BL in FIG. 20(a). Furthermore, the luminescent region LR1 is assumed to have the same characteristics and the shape as those of the luminescent region LR10.

FIG. 10(a) is a cross-section of the base-equipped lens 18BL along the A-A' line in the top view PA of FIG. 7. FIG. 10(b) is a cross-section of the base-equipped lens 18BL along the B-B' line in the top view PA. FIG. 10(c) is a cross-section of the base-equipped lens 18BL along the C-C' line in the top view PA. FIG. 10(d) is a cross-section of the base-equipped lens 18BL along the D-D' line in the top view PA.

FIG. 10(e) is a cross-section of the base-equipped lens 18BL along the E-E' line in the top view PA.

Each of FIGS. 10(b), 10(c), 10(d), and 10(e) illustrates an example of light paths of light that enters a position LP2 in the light emitted from the luminescent region LR1, and is then emitted from the position LP2. In FIG. 10, the light traveling from within the base-equipped lens 18BL toward an air space is slightly deflected. However, the path of the slightly deflected light is indicated by a straight arrow for convenience of the drawing in FIG. 10.

FIG. 10(a) illustrates a state where light enters the position LP2, and a part of the light emitted from the position LP2 is reflected from an interface between the lens base layer 18D and the air space and is not extracted outside of the base-equipped lens 18BL.

However, each of FIG. 10(b), FIG. 10(c), FIG. 10(d), and FIG. 10(e) illustrates the light paths of light that enters the position LP2 all of which are then emitted from the position LP2 and extracted outside of the base-equipped lens 18BL.

Figure 20:
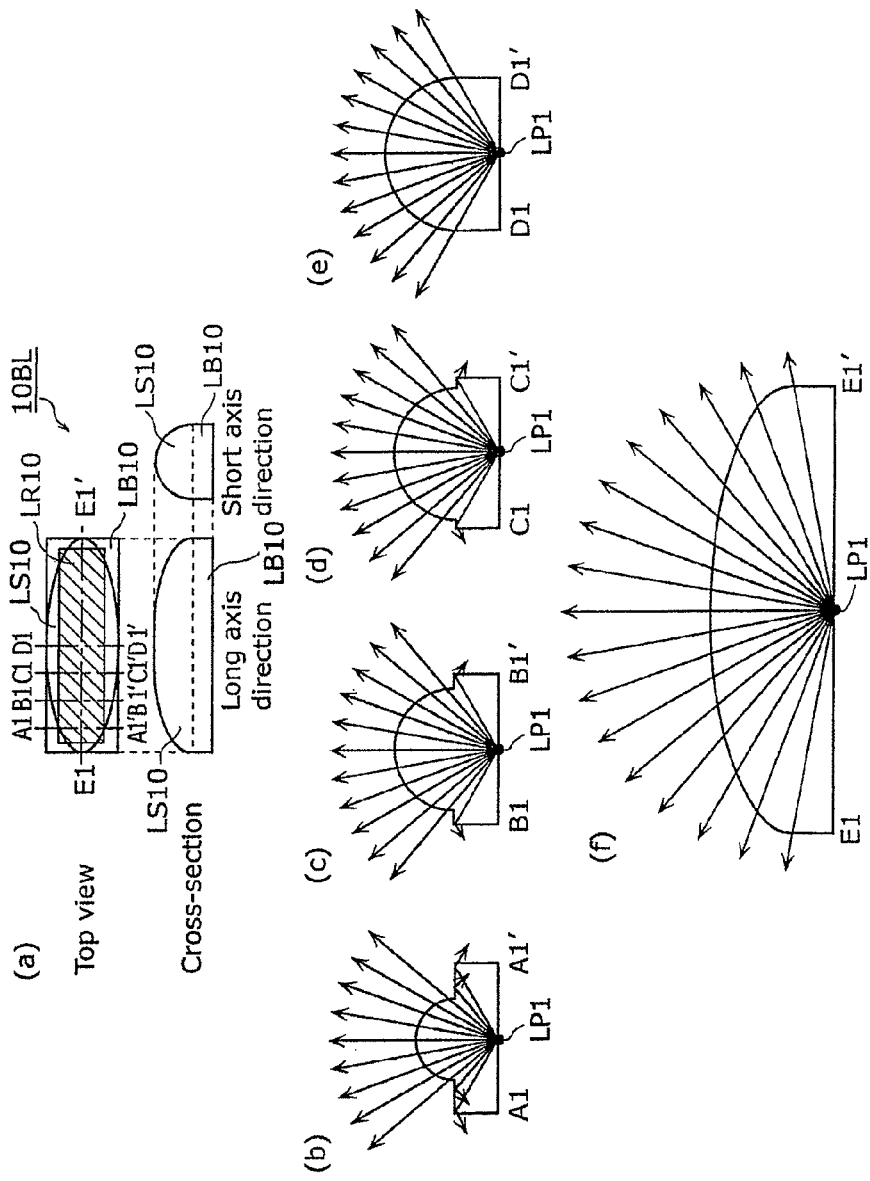
FIG. 20 illustrates a shape of a conventional lens.

Thus, FIGS. 20 and 10 indicate that the base-equipped lens 18BL can more effectively extract light in the short axis direction than the conventional base-equipped lens 10BL.

The cross-section of the base-equipped lens 18BL in FIG. 10(a) may have the same shape as that of the base-equipped lens 18BL in FIG. 10(b). Accordingly, the light-extraction efficiency can be further improved.

Figure 11:
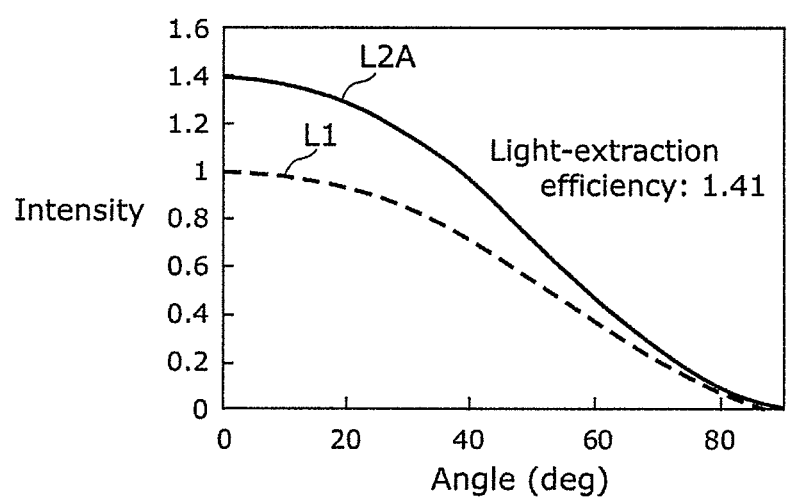
FIG. 11 illustrates the light-extraction efficiency of the lens.

FIG. 11 illustrates the light-extraction efficiency of the lens 18.

In FIG. 11, "Angle" denotes an angle between a direction of light traveling toward the luminescent face and a Z axis in the light emitted from the luminescent region LR1. Here, the Z axis is vertical to the surface of the luminescent region LR1. The detailed description of "Intensity" will not be repeated as described for FIG. 21.

Figure 21:
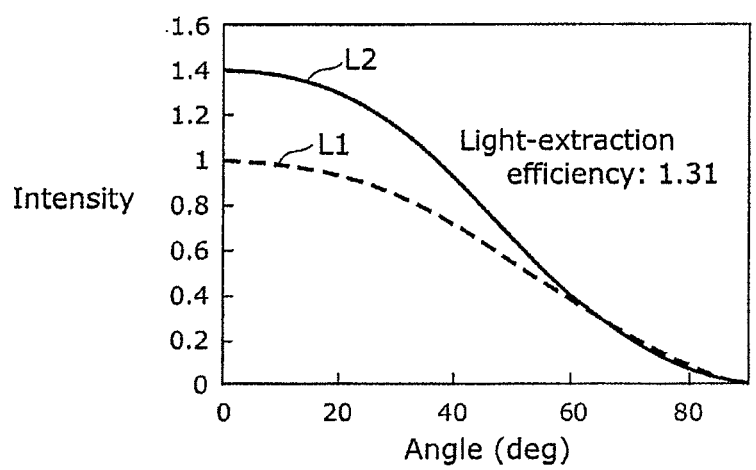
FIG. 21 illustrates the light-extraction efficiency of the conventional lens.

The detailed description of the characteristic curve L1 in FIG. 11 will not be repeated as described for FIG. 21. A characteristic curve L2A represents a relationship between the intensity of light and the angle when the lens 18 is provided above each of the sub-pixel units. Here, the lens 18 has a refractive index of 1.5.

The refractive index in the Specification is assumed to be a refractive index when a target component is measured with light at a wavelength of 530 nm. For example, the refractive index of the lens 18 is a refractive index when the lens 18 is measured with the light at the wavelength of 530 nm.

Here, compared to the case where the lens L18 is not provided, the light-extraction efficiency will be improved with the lens L18. As the light-extraction efficiency when the lens L18 is not provided is represented by 1, the light-extraction efficiency when the lens L18 is provided is represented by 1.41. In other words, compared to the case where the lens L18 is not provided, the light-extraction efficiency will be improved with the lens L18 by 41 percent.

As described above, the light-extraction efficiency with the conventional lens LS10 will be improved by 31 percent. In contrast, the light-extraction efficiency with the lens L18 will be improved by 41 percent. As indicated by 141/131=1.08, the display panel device 400 with the plurality of lenses 18 can improve the light-extraction efficiency by 8 percent, compared to the light-extraction efficiency of the conventional display panel device.

In other words, the display panel device 400 with the lenses 18 can achieve the higher light-extraction efficiency than that having the structure with the conventional lens LS10.

As described above, there is a problem that as a distance between the conventional lens LS10 having the shape as illustrated in FIG. 20(a) and the center part of the luminescent region LR10 in the long axis direction of the lens LS10 is greater, the light-extraction efficiency decreases to a larger extent. This problem occurs because the cross section of the upper portion of the lens LS10 in the long axis direction has a shape of an elliptical arc.

In order to solve the problem, flattening the upper portion of the cross section of the lens LS10 in the long axis direction is conceivable. A lens obtained by flattening the upper portion of the cross section of the lens LS10 in the long axis direction will be hereinafter referred to as an upper flat lens. Furthermore, when the upper flat lens is provided above each of the pixel units arranged in a matrix, the plurality of upper flat lenses will be referred to as an upper flat lens portion L10A. The upper flat lens portion L10A is not a lens portion according to Embodiment 1.

FIG. 22 illustrates a part of the upper flat lens portion L10A.

FIG. 22(a) illustrates a cross-section of the upper flat lens portion L10A in the short axis direction. In other words, the plurality of upper flat lenses is provided in the short axis direction.

A sealing glass 210 is provided above the upper flat lens portion L10A. The upper flat lens portion L10A and the sealing glass 210 are bonded with a resin 200.

FIG. 22(b) illustrates a cross-section of the upper flat lens portion L10A in the long axis direction. In other words, the plurality of upper flat lenses is provided in the long axis direction. For example, FIG. 22(b) illustrates two upper flat lenses. Each cross-section of the end parts of the upper flat lenses in the long axis direction has a shape vertical to the bottom of the upper flat lens.

When the resin 200 is applied to the upper flat lens portion L10A and the sealing glass 210 to be bonded in manufacturing processes, the two upper flat lenses in FIG. 22(b) have a hollow 201 therebetween with which the resin 200 is not filled, and air enters the hollow 201. With the air entering the hollow 201, the characteristics of the lenses that have been determined in designing are changed, and the light-extraction efficiency decreases.

In contrast, the lens portion L18A according to Embodiment 1 has the following structure.

Figure 12:
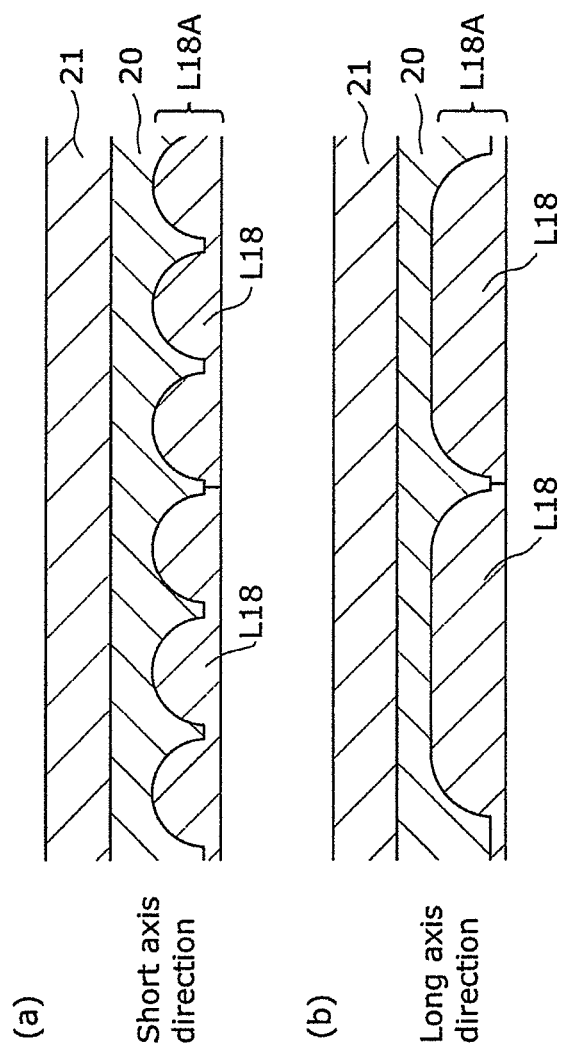
FIG. 12 illustrates a part of the lens portion.

FIG. 12 illustrates a part of the lens portion L18A. As described above, the lens portion L18A is a lens composed of the plurality of lenses L18 included in the display panel device 400.

FIG. 12(a) illustrates a cross-section of the lens portion L18A in the short axis direction. A sealing glass 21 is provided above the lens portion L18A. The lens portion L18A is bonded to the sealing layer 21 with the resin layer 20. A plurality of lens portions L18 is provided in the short axis direction. The resin layer 20 is a layer for planarizing unevenness formed by the lens portions L18 included in the lens portion L18A. Each of the lens portions L18 includes the three lenses 18 each with the shape illustrated in FIG. 9(b). In other words, the resin layer 20 is a layer for planarizing unevenness formed by the lenses 18 included in each of the lens portions L18A.

FIG. 12(b) illustrates a cross-section of the lens portion L18A in the long axis direction. The plurality of lens portions L18 is provided in the long axis direction. Each of the lens portions L18A includes the lenses 18 each with the shape illustrated in FIG. 9(a).

With reference to FIG. 9(a), FIG. 12(a), and FIG. 12(b), each cross-section of the end parts of the lens 18 in the long axis direction has the shape of an elliptic arc (an arc) having a predetermined curvature. Furthermore, each cross-section of the lens 18 in the short axis direction has the shape of an elliptic arc (an arc) having a predetermined curvature.

Here, a surface of the lenses 18 each having the shape of the elliptic arc (arc) functions as a guide face that causes a resin that is a material included in the resin layer 20 to flow into depressed portions between the lenses 18, where the surface is, at each of the both end parts, (i) the cross-section of the lens portion L18A in the short axis direction and (ii) the cross-section of the lens portion L18A in the long axis direction.

Accordingly, the resin that is a material included in the resin layer 20 flows into the surface of the elliptic arc (arc) shaped lenses 18, and fills the depressed portions between the lenses 18. Thus, the depressed portions between the lenses 18 are filled with the resin layer 20 without any hollow, and it is possible to prevent air from entering the depressed portions between the lenses 18. As a result, it is possible to prevent the characteristics of the lens 18 from changing, and extract light with higher precision.

Furthermore, in order to cause the resin that is a material included in the resin layer 20 to flow into the depressed portions between the lenses 18, not a separate guide component but the surface of the existing lenses 18 is used. Thus, the resin can fill the depressed portions between the lenses 18 without thickening the layers stacked on the pixel units PX. As a result, it is possible to suppress thickening of the layers, prevent the characteristics of the lens 18 from changing, and extract light with higher precision.

Here, the lens 18 has a refractive index of 1.78, and the resin layer 20 has a refractive index of 1.35.

Figure 13:
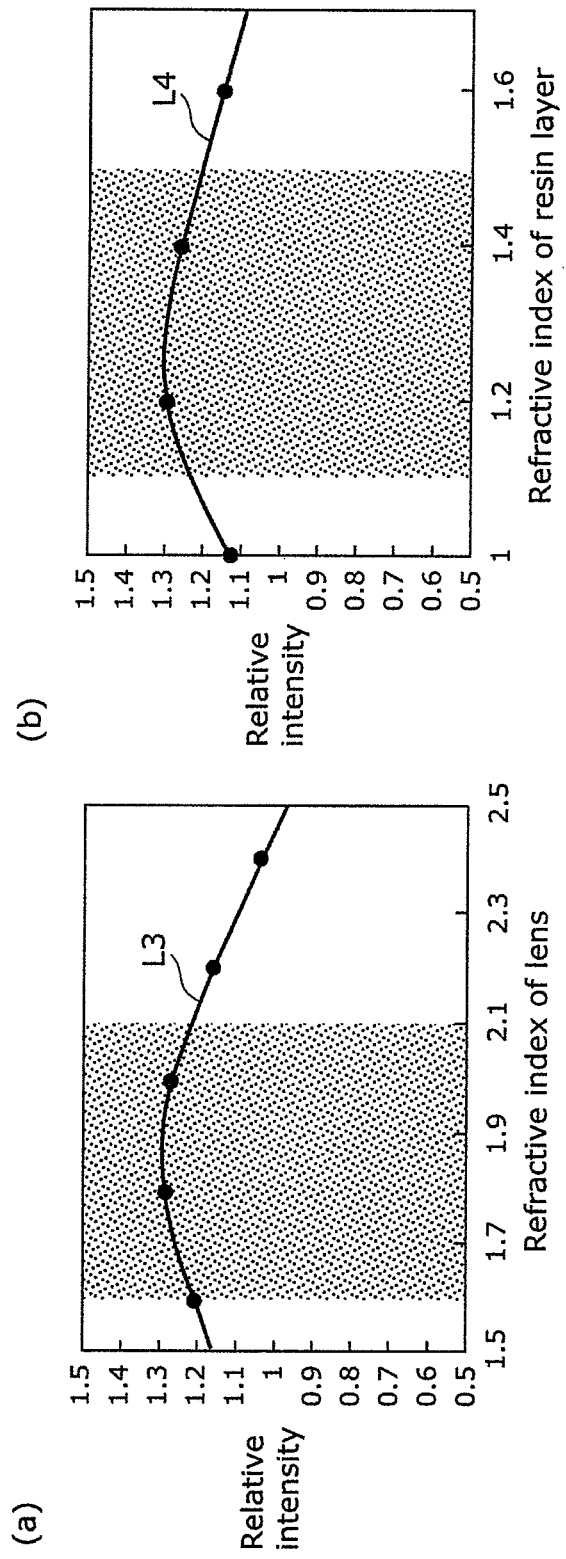
FIG. 13 illustrates relationships between the refractive indexes and the relative intensity of light.

FIG. 13 illustrates relationships between the refractive indexes and the relative intensity of light.

FIG. 13(a) illustrates a relationship between the refractive index of a lens and the relative intensity of light.

In FIG. 13(a), "Relative intensity" is represented by a value LIT1/LIT0, where LIT0 denotes the intensity of light without any lens, and LIT1 denotes the intensity of light with lenses.

As the value of the relative intensity is larger, the light-extraction efficiency is higher.

Here, "Refractive index of lens" denotes a refractive index of the lens 18. A characteristic curve L3 represents a relationship between "Relative intensity" and "Refractive index of lens".

In other words, FIG. 13(a) illustrates change in the light-extraction efficiency when the refractive index of the lens 18 has been changed.

With the characteristics illustrated in FIG. 13(a), the lens 18 according to Embodiment 1 is made of a resin with a refractive index ranging between 1.6 and 2.1 inclusive.

The material included in the lens 18 may be any as long as conditions of the refractive index are satisfied. The material included in the lens 18 may be any resins, such as an acrylic resin, an epoxy resin, and polyethylene terephthalate.

FIG. 13(b) illustrates a relationship between the refractive index of a resin layer and the relative intensity of light.

The detailed description of "Relative intensity" will not be repeated as described for FIG. 13(a). Here, "Refractive index of resin layer" denotes a refractive index of the resin layer 20. A characteristic curve L4 represents a relationship between "Relative intensity" and "Refractive index of resin layer".

In other words, FIG. 13(b) illustrates change in the light-extraction efficiency when the refractive index of the resin layer 20 has been changed.

With the characteristics illustrated in FIG. 13(b), the resin layer 20 according to Embodiment 1 is made of a resin with a refractive index ranging between 1.1 and 1.5 inclusive. The material included in the resin layer 20 may be any as long as conditions of the refractive index are satisfied. The material included in the resin layer 20 may be any resins, for example, an epoxy resin, an acrylic resin, and a silicon resin.

With the use of the lens 18 and the resin layer 20 each of which is made of such materials, it is possible to suppress the amount of light that is entirely reflected from a boundary of the lens 18 in the light that enters the boundary, and to extract, at a maximum, the light that is deflected from the boundary without being entirely reflected. As a result, the light-extraction efficiency of the lens 18 can be maximized.

As described above, the display panel device 400 according to Embodiment 1 can significantly improve the light-extraction efficiency. In other words, the higher light-extraction efficiency can be achieved.

Modification of Embodiment 1

In Embodiment 1, the height between the luminescent face 19 of the luminescent region LR1 and the apex of the lens 18 is uniform for each of the sub-pixel units.

In a modification of Embodiment 1, the height between the luminescent face 19 and the apex of the lens 18 is different for each of the sub-pixel units PXR, PXG, and PXB included in the pixel units.

The display device 1000 according to Embodiment 1 will be also used for the description of the modification hereinafter. Thus, the detailed description of the display device 1000 will not be repeated.

Figure 14:
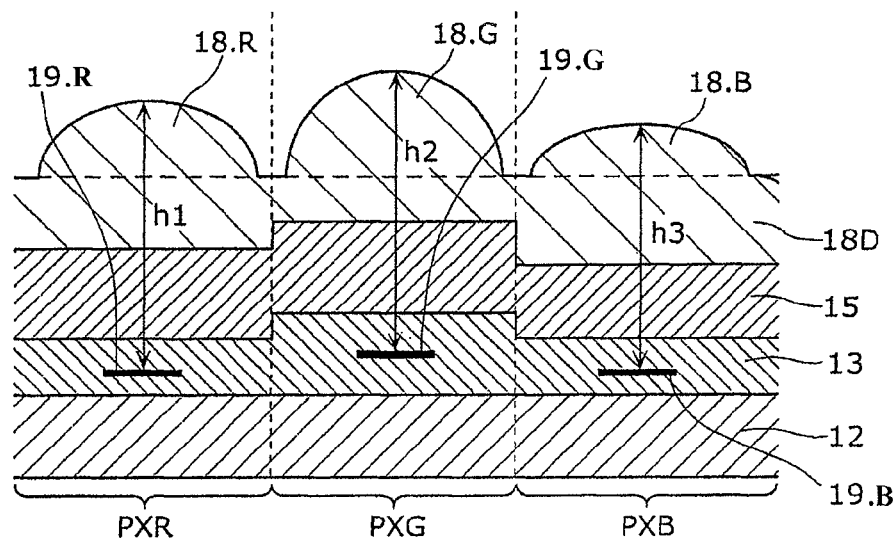
FIG. 14 illustrates lenses according to a modification of Embodiment 1.

FIG. 14 illustrates the lenses 18 according to the modification of Embodiment 1. FIG. 14 is a cross-section simply illustrating a part of FIG. 6.

Here, h1 denotes a height between the luminescent face 19.R of the luminescent region LR1.1 (see, FIG. 5) corresponding to the lens 18.R and the apex of the lens 18.R. Furthermore, h2 denotes a height between the luminescent face 19.G of the luminescent region LR1.2 (see, FIG. 5) corresponding to the lens 18.G and the apex of the lens 18.G.

Furthermore, h3 denotes a height between the luminescent face 19.B of the luminescent region LR1.3 (see, FIG. 5) corresponding to the lens 18.B and the apex of the lens 18.B.

The blue light (B) has the largest energy among the three primary colors of RGB. Furthermore, the human eyes are more sensitive to the green light. Thus, in order to increase the resolution of an image to be displayed on the display unit 410, the structure that increases the light-extraction efficiency of the green light (G) is used herein.

More specifically, the thickness of the organic layer 13 included in the sub-pixel unit PXG is set to be the largest, among the sub-pixel units PXR, PXG, and PXB as illustrated in FIG. 14. Furthermore, the thickness of the organic layer 13 included in the sub-pixel unit PXB is set to be the smallest, among the sub-pixel units PXR, PXG, and PXB.

Furthermore, the curvature of the lens 18.G is set to be the smallest, among the lenses 18.R, 18.G, and 18.B. Furthermore, the curvature of the lens 18.B is set to be the largest, among the lenses 18.R, 18.G, and 18.B.

As described above, the heights h1, h2, and h3 satisfy a relationship of h2>h1>h3. Furthermore, the relationship between the heights h1, h2, and h3 is not limited to h2>h1>h3. Furthermore, the heights h1, h2, and h3 may have a relationship of h2>h1=h3.

In other words, the height of the optimal lens 18 is different for each of the colors. According to the modification of Embodiment 1, the lens 18.G that transmits the green light has the largest height.

In other words, the height between the luminescent face 19 of the luminescent region LR1 and the apex of the corresponding lens is defined according to the color (red, green, or blue) of the light emitted from the luminescent layer 133 of each of the sub-pixel units PXR, PXG, and PXB. In other words, the height between the luminescent face 19 of the luminescent region LR1 and the apex of the corresponding lens is defined according to one of red, green, and blue of the light emitted from the luminescent layer 133.

Accordingly, the light-extraction efficiency can be maximized according to each color by defining the optimal length in each of the colors.

(Method of Manufacturing Lenses)

Next, a method of manufacturing the lens portion L18A including the lenses 18 will be described.

Figure 15:
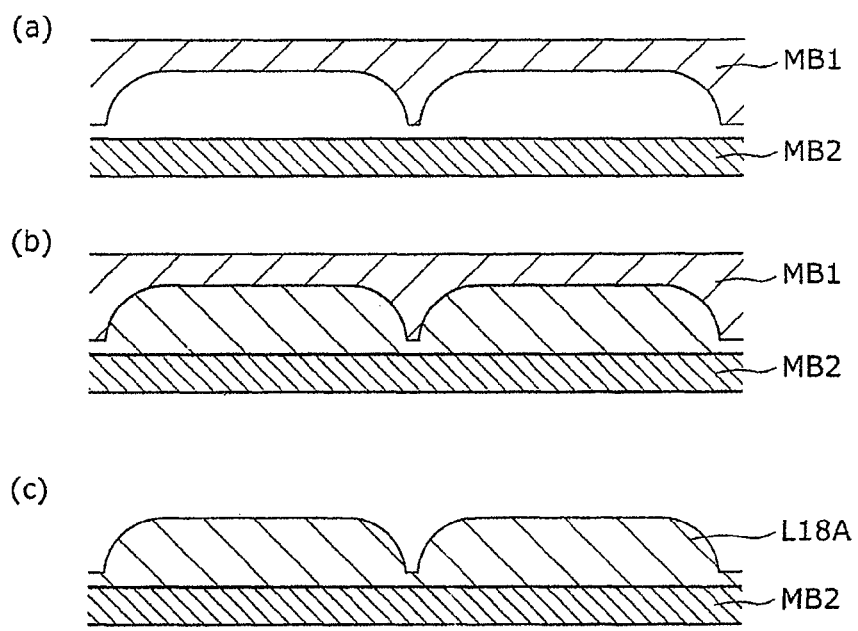
FIG. 15 illustrates a cross-section of a lens portion in the long axis direction for describing a method of manufacturing thereof.

FIG. 15 illustrates a cross-section of the lens portion L18A in the long axis direction for describing the method of manufacturing thereof.

First, a mold MB1 and a mold MB2 are placed as illustrated in FIG. 15(a). The mold MB1 is obtained by cutting away only a portion of the lens portion L18A in FIG. 12(b). The mold MB2 is a flat mold. In other words, space (hereinafter referred to as lens space) with the shape of the lens portion L18A in FIG. 12(b) is provided between the mold MB1 and the mold MB2.

Next, a resin to be a material (for example, an acrylic resin and an epoxy resin) of the lenses 18 fills the lens space (see FIG. 15(b)).

Then, ultraviolet rays are irradiated to the resin that fills the lens space. Accordingly, the resin that fills the lens space is cured.

After the resin is cured, the mold MB1 is removed (see FIG. 15(c)). In this manner, the lens portion L18A is generated.

(Method of Manufacturing Display Panel Device)

Next, a method of manufacturing the display panel device 400 will be described.

Figure 16:
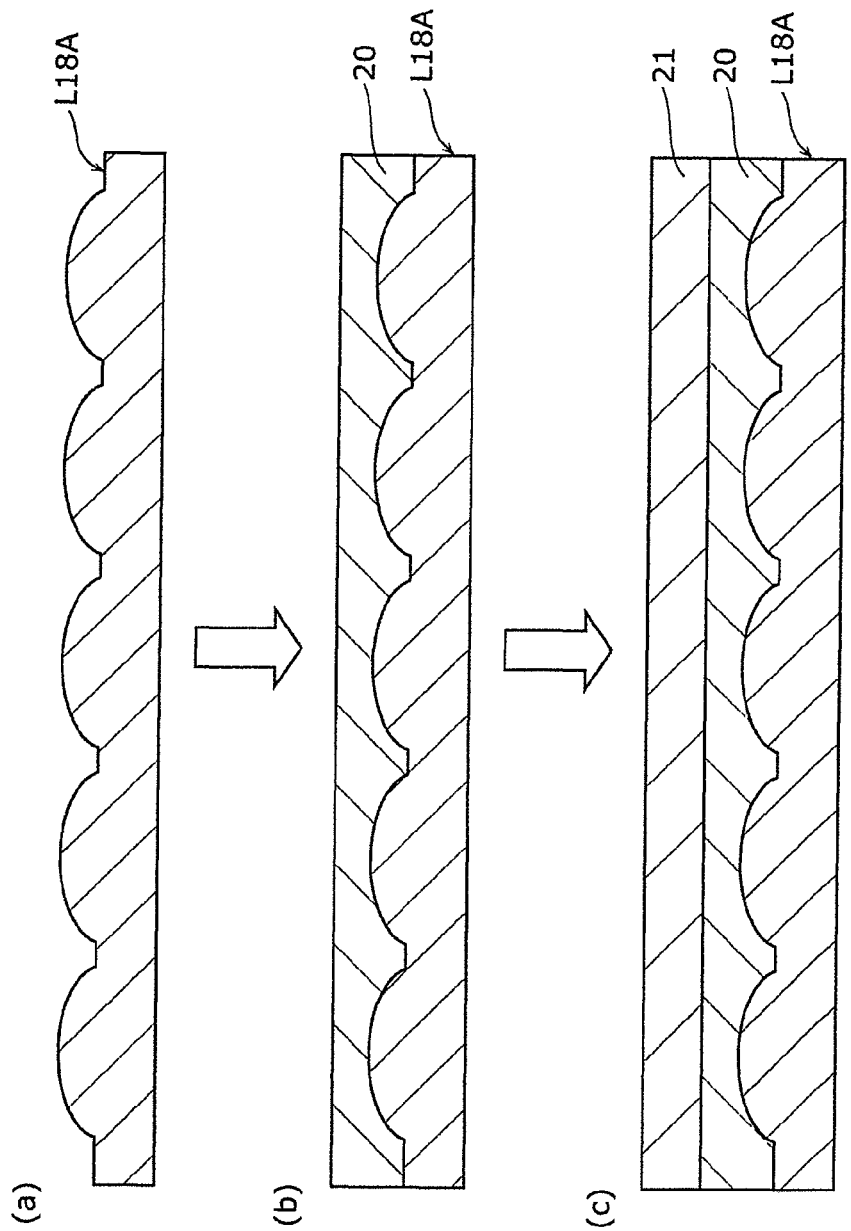
FIG. 16 is a cross-section for describing the method of manufacturing the display panel device.
Figure 17:
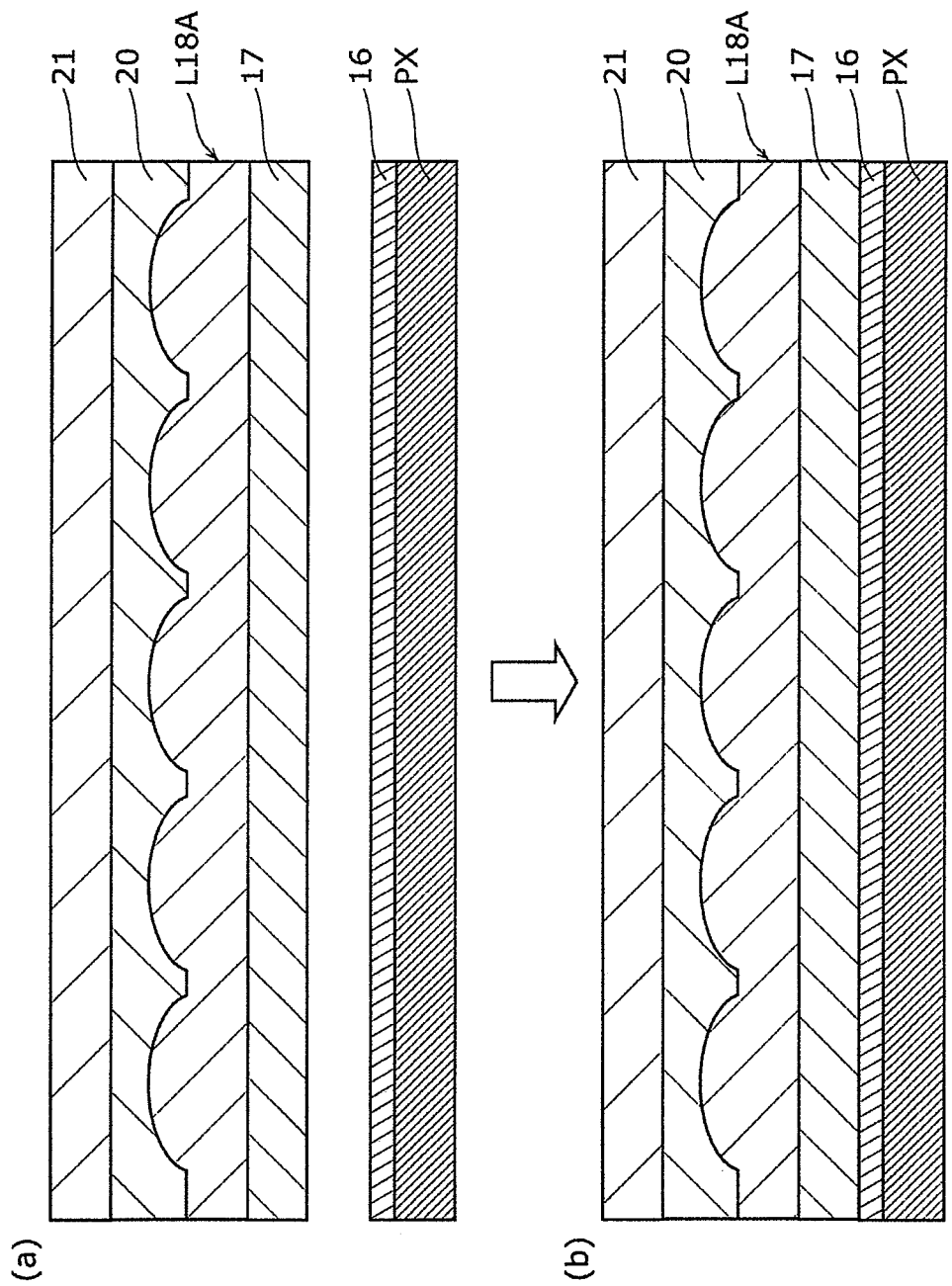
FIG. 17 is a cross-section for describing the method of manufacturing a display panel device.

FIGS. 16 and 17 are cross-sections for describing the method of manufacturing the display panel device 400. FIGS. 16 and 17 partly illustrate the simplified shapes of the constituent elements.

Figure 18:
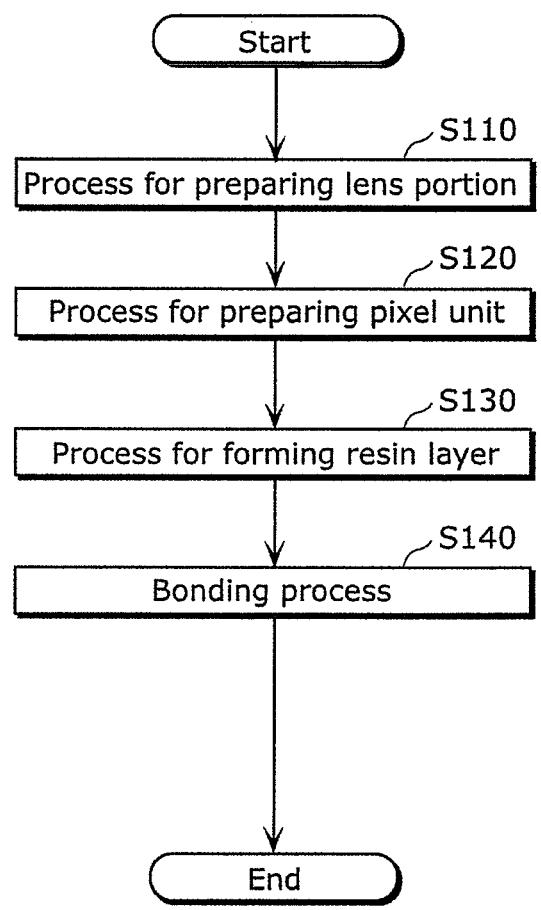
FIG. 18 is a flowchart illustrating an example of the method of manufacturing a display panel device.

FIG. 18 is a flowchart illustrating an example of the method of manufacturing the display panel device 400. FIG. 18 illustrates only main manufacturing processes of the method of manufacturing the display panel device 400.

First, a process for preparing a lens portion (S110) is performed as a first process. In the process for preparing a lens portion, the lens portion L18A is prepared (see FIG. 16(a)). The lens portion L18A has the lenses 18. The lenses 18 cover the luminescent region LR1 to correspond to the luminescent layer 133 that defines the luminescent region LR1 in the shape having a long axis and a short axis, and transmit light emitted from the luminescent layer 133. In other words, the process for preparing a lens portion is a process for preparing the lens portion L18A.

Next, a process for bonding a sealing glass is performed. In the process for bonding a sealing glass, first, the resin layer 20 is formed on the lens portion L18A as a bonding layer (see FIG. 16(b)).

Then, the sealing glass 21 is placed on the resin layer 20 (see FIG. 16(c)). Accordingly, the sealing layer 21 is bonded to the lens portion L18A through the resin layer 20.

Next, a process for preparing a pixel unit (S120) is performed as a second process. In the process for preparing a pixel unit, the pixel unit PX in which the luminescent layer 133 is covered with the sealing layer 16 is prepared (see FIG. 17(a)). FIG. 17(a) illustrates the pixel unit PX as the pixel units PX for simplifying the drawing. In other words, the process for preparing a pixel unit is a process of preparing the pixel unit PX that includes the luminescent layer 133 and is covered with the sealing layer 16.

Next, a process for forming a resin layer (S130) is performed as a third process. In the process for forming a resin layer, the resin layer 17 is formed beneath the lens portion L18A (see FIG. 17(a)). In other words, the process for forming a resin layer is a process for forming the resin layer 17 beneath the lens portion L18A.

Next, a bonding process (S140) is performed as a fourth process. In the bonding process, the lens portion L18A beneath which the resin layer 17 is formed is bonded to the pixel unit PX on which the sealing layer 16 is formed. Then, the resin layer 17 is cured. Accordingly, the lens portion L18A is bonded to the pixel unit PX through the resin layer 17 and the sealing layer 16 (see FIGS. 6 and 17(b)).

In other words, the bonding process is a process for bonding the lens portion L18A to the pixel unit PX, and curing the resin layer 17.

As described above, the display unit 410 in which the lens portion L18A is formed above the pixel units PX is manufactured.

Then, the display panel device 400 is manufactured by forming the data line driving circuit 220, the scanning line driving circuit 300, and others in FIG. 2.

(External View of a Display Device)

Figure 19:
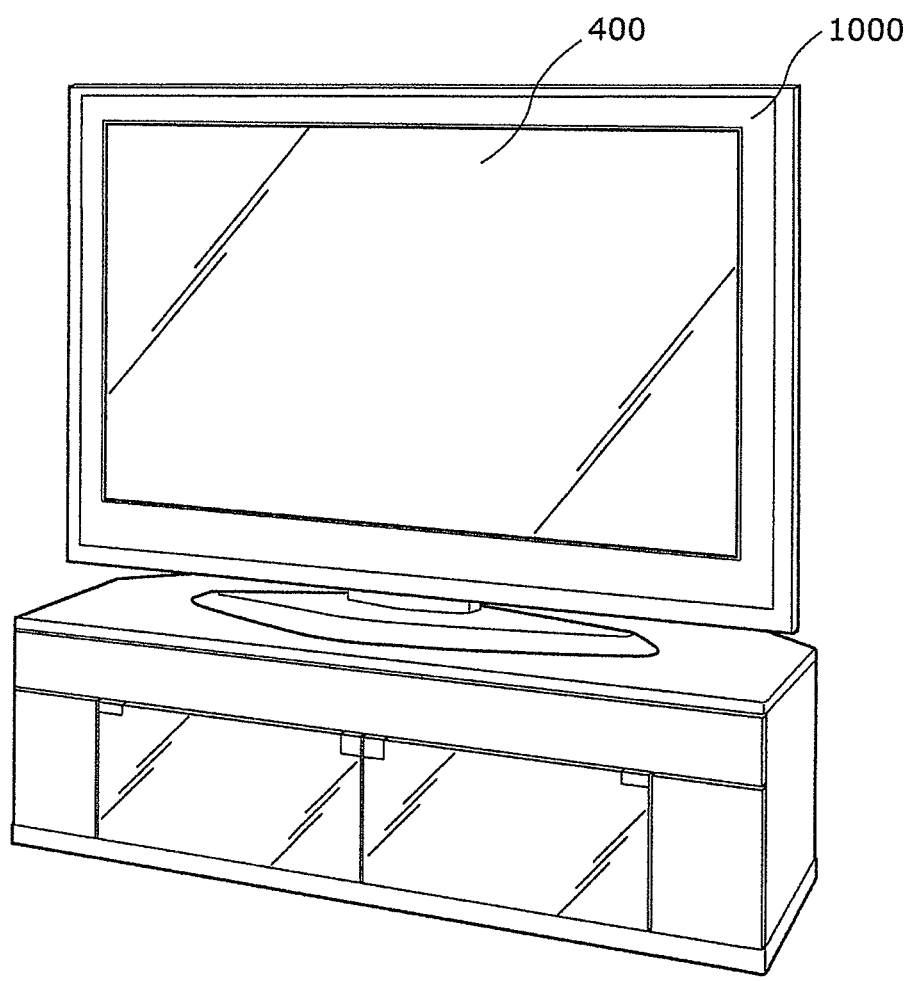
FIG. 19 is an external view of a display device including a display panel device.

FIG. 19 is an external view of the display device 1000 including the display panel device 400.

Although the display panel device according to the present disclosure is described hereinbefore based on Embodiment 1 and the modification, the present disclosure is not limited to these. Without departing from the scope of the present disclosure, the present disclosure includes an embodiment with some modifications on Embodiment 1 and the modification which are conceived by a person skilled in the art, and an embodiment by combining the constituent elements included in Embodiment 1 and the modification.

Embodiment 1 and the modification disclosed this time are exemplifications in all respects, and should be regarded as not limiting the scope of the present disclosure. The scope of the present disclosure is indicated not by the description but by Claims, and is intended to include all the modifications within Claims, meanings of equivalents, and the scope of the equivalents. Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The display panel device 400 according to the present disclosure is useful as a high-efficiency display because it can significantly improve the light-extraction efficiency.

The invention claimed is:

1. A display panel device, comprising:
a pixel unit including a luminescent layer that defines a luminescent region having a long axis and a short axis; and
a lens that is located above the pixel unit, covers the luminescent region, and transmits light emitted from the luminescent layer,
wherein a height between a luminescent face of the luminescent region and an apex of the lens is uniform along a straight line in a long axis direction of the luminescent region, and in the lens, a cross-section of a light emitting side corresponding to a short axis direction of the luminescent region has a uniform shape in the long axis direction of the luminescent region in which the height is uniform, and
at both end parts of the lens, each of (i) the cross-section of the light emitting side corresponding to the short axis direction of the luminescent region and (ii) a cross-section of the light emitting side corresponding to the long axis direction of the luminescent region has a shape of an elliptic arc having a predetermined curvature, and the lens deflects the light emitted from the luminescent layer in both of the short axis direction and the long axis direction of the luminescent region,
wherein the display panel device satisfies h/w≤1, where w denotes a length of a bottom face of the lens that corresponds to the short axis direction of the luminescent region, and h denotes the height between the luminescent face of the luminescent region and the apex of the lens.

2. The display panel device according to claim 1, wherein the shape of the elliptic arc includes a shape of a circular arc.

3. The display panel device according to claim 1,
wherein the pixel unit includes a plurality of luminescent layers including the luminescent layer,
a plurality of lenses are provided for the plurality of luminescent layers, the lenses including the lens,
the display panel device further comprises a resin layer that is provided over the lenses to planarize unevenness of the lenses, and
a surface of the lenses, each having the shape of the elliptic arc, comprises a guide face that causes a resin that is a material included in the resin layer to flow into depressed portions between the lenses.

4. The display panel device according to claim 3,
wherein the luminescent layers include a red luminescent layer, a green luminescent layer, and a blue luminescent layer.

5. The display panel device according to claim 4,
wherein the height between the luminescent face of the luminescent region and the apex of the lens that covers the luminescent region is defined according to one of red, green, and blue light emitted from the luminescent layer.

6. The display panel device according to claim 3,
wherein the lens comprises a first resin with a refractive index ranging between 1.6 and 2.1 inclusive, and
the resin layer further comprises a second resin with a refractive index ranging between 1.1 and 1.5 inclusive.

7. The display panel device according to claim 1,
wherein the lens comprises a resin with a refractive index ranging between 1.6 and 2.1 inclusive.

8. The display panel device according to claim 1,
wherein when a cross-section of the lens in the long axis direction is projected on an x-z plane, a shape of the cross-section of the lens in the long axis direction is defined by:

$$\frac{(x-c)^2}{d^2} + \frac{z^2}{b^2} = 1 \; c \le |x| \le c+d$$

and $$z = b \;\; |x| \le c$$

where x denotes the long axis direction of the lens, z denotes a height direction of the lens and is equal to or greater than 0, c denotes a half length of a range in which the height between the luminescent face of the luminescent region and the apex of the lens is uniform along the straight line in the long axis direction of the lens, d denotes a length of each of the elliptic end parts of the lens in the long axis direction, and b denotes a height between a bottom face of the lens and the apex of the lens, and
when the cross-section of the lens is projected on a y-z plane, the shape of the cross-section of the lens in the short axis direction is defined by:

$$\frac{y^2}{a^2} + \frac{z^2}{b^2} = 1$$

where y denotes the short axis direction of the lens, and the length of the lens in the short axis direction is represented by 2a.

9. The display panel device according to claim 1, wherein the lens lenses is a convex lens.

10. The display panel device according to claim 1,
wherein the pixel unit includes an upper electrode and a lower electrode, and
the luminescent layer is provided between the upper electrode and the lower electrode.

11. The display panel device according to claim 10,
wherein the pixel unit further includes a hole injection layer between the luminescent layer and the lower electrode.

12. The display panel device according to claim 10, wherein the luminescent layer comprises a red luminescent layer, a green luminescent layer, and a blue luminescent layer, a thickness between a top surface of the upper electrode and a top surface of the lower electrode is different for each of the red luminescent layer, the green luminescent layer and the blue luminescent layer, and a height of the luminescent face from the top surface of the lower electrode is different for each of the red luminescent layer, the green luminescent layer and the blue luminescent layer.

13. The display panel device according to claim 1, wherein end portions of the luminescent region in the long axis direction are covered with the end parts of the lens, each of the end parts having the shape of the elliptic arc.

14. A display device, comprising
the display panel device according to claim 1,
wherein a plurality of pixel units is arranged in a matrix, the pixel units including the pixel unit.

15. A method of manufacturing a display panel device, comprising:
preparing a lens portion including a lens that covers a luminescent region, the lens corresponding to a luminescent layer that defines the luminescent region having a long axis and a short axis, the lens transmitting light emitted from the luminescent layer;
preparing a pixel unit that includes the luminescent layer and is covered with a sealing layer;
forming a resin layer beneath the lens portion; and
bonding the lens portion to the pixel unit, and curing the resin layer,
wherein a height between a luminescent face of the luminescent region and an apex of the lens is uniform along a straight line in a long axis direction of the luminescent region, and in the lens, a cross-section of a light emitting side corresponding to a short axis direction of the luminescent region has a uniform shape in the long axis direction of the luminescent region in which the height is uniform, and
at both end parts of the lens, each of (i) the cross-section of the light emitting side corresponding to the short axis direction of the luminescent region and (ii) a cross-section of the light emitting side corresponding to the long axis direction of the luminescent region has a shape of an elliptic arc having a predetermined curvature, and the lens deflects the light emitted from the luminescent layer in both of the short axis direction and the long axis direction of the luminescent region,
wherein the display panel device satisfies $h/w \leq 1$, where w denotes a length of a bottom face of the lens that corresponds to the short axis direction of the luminescent region, and h denotes the height between the luminescent face of the luminescent region and the apex of the lens.

* * * * *